(12) United States Patent
Choi et al.

(10) Patent No.: US 11,933,808 B2
(45) Date of Patent: Mar. 19, 2024

(54) BUFFER UNIT AND METHOD FOR STORAGING SUBSTRATE TYPE SENSOR FOR MEASURING OF HORIZONTALITY OF A SUBSTRATE SUPPORT MEMBER PROVIDED ON A TEMPERATURE VARYING ATMOSPHERE

(71) Applicant: SEMES CO., LTD., Cheonan-si (KR)

(72) Inventors: Young Seop Choi, Cheonan-si (KR); Yong-Jun Seo, Hwaseong-si (KR); Sang Hyun Son, Busan (KR); Ji Young Lee, Cheonan-si (KR); Gyeong Ryul Kim, Seoul (KR); Sun Yong Park, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/564,676

(22) Filed: Dec. 29, 2021

(65) Prior Publication Data
US 2022/0206031 A1    Jun. 30, 2022

(30) Foreign Application Priority Data

Dec. 31, 2020    (KR) .................. 10-2020-0189441

(51) Int. Cl.
| | |
|---|---|
| *G01P 1/02* | (2006.01) |
| *G01C 9/00* | (2006.01) |
| *G01P 15/18* | (2013.01) |
| *H02J 7/02* | (2016.01) |
| *H02J 50/10* | (2016.01) |

(52) U.S. Cl.
CPC ................ *G01P 1/023* (2013.01); *G01C 9/00* (2013.01); *G01P 15/18* (2013.01); *H02J 7/02* (2013.01); *H02J 50/10* (2016.02)

(58) Field of Classification Search
CPC ....................................................... G01C 9/00
See application file for complete search history.

(56) References Cited

U.S. PATENT DOCUMENTS

| | | | |
|---|---|---|---|
| 9,275,847 B2 | 3/2016 | Jung et al. | |
| 9,506,695 B2 | 11/2016 | Kim et al. | |
| 9,587,880 B2 | 3/2017 | Kim et al. | |
| 10,529,607 B2 | 1/2020 | Ito | |
| 2004/0225462 A1* | 11/2004 | Renken | H01L 21/6732 |
| | | | 702/94 |

(Continued)

FOREIGN PATENT DOCUMENTS

| | | |
|---|---|---|
| JP | 2005202933 | 7/2005 |
| JP | 2006513583 | 4/2006 |

(Continued)

OTHER PUBLICATIONS

Machine translation of JP 2009-012107 (Year: 2009).*

(Continued)

*Primary Examiner* — Walter L Lindsay, Jr.
*Assistant Examiner* — Andrew V Do

(57) ABSTRACT

A buffer unit for temporarily storing a substrate includes a housing having a space for storing a substrate therein, one or more slots disposed within the housing for placing a substrate thereon, and a holding unit disposed at a bottom portion of the housing, having a flat and non-inclined top surface, and comprising a built-in wireless charging module. A substrate type sensor is stored at the holding unit.

8 Claims, 16 Drawing Sheets

(56) References Cited

U.S. PATENT DOCUMENTS

2004/0267501 A1* 12/2004 Freed ................ H02J 50/005
702/184
2017/0345861 A1    11/2017 Yang et al.
2020/0402818 A1    12/2020 Lee et al.
2022/0205782 A1*   6/2022 Choi ................ G01P 15/08

FOREIGN PATENT DOCUMENTS

| | | | |
|---|---|---|---|
| JP | 2009012107 | | 1/2009 |
| JP | 2009012107 A | * | 1/2009 |
| JP | 4874540 | | 12/2011 |
| JP | 2019027944 | | 2/2019 |
| KR | 100936085 | | 11/2004 |
| KR | 10-2016-0144727 | | 12/2016 |
| KR | 102016398 | | 2/2019 |
| WO | 2016032241 | | 3/2016 |

OTHER PUBLICATIONS

Office Action from the Korea Intellectual Property Office dated Oct. 12, 2022.
Office Action from the Japan Patent Office dated Feb. 7, 2023.

* cited by examiner

540

BUFFER UNIT AND METHOD FOR STORAGING SUBSTRATE TYPE SENSOR FOR MEASURING OF HORIZONTALITY OF A SUBSTRATE SUPPORT MEMBER PROVIDED ON A TEMPERATURE VARYING ATMOSPHERE

CROSS-REFERENCE TO RELATED APPLICATIONS

A claim for priority under 35 U.S.C. § 119 is made to Korean Patent Application No. 10-2020-0189441 filed on Dec. 31, 2020, in the Korean Intellectual Property Office, the entire contents of which are hereby incorporated by reference.

BACKGROUND

Embodiments of the inventive concept described herein relate to a buffer unit and a method for storing a substrate type sensor for measuring of a horizontality of a support member provided on a temperature varying atmosphere.

Generally, semiconductor devices are manufactured from substrates such as wafers. Specifically, the semiconductor devices are manufactured by forming fine circuit patterns on a top surface of a substrate by performing processes such as deposition, photolithography, cleaning, drying, and etching etc.

The substrate may be contaminated with various foreign materials on the top surface on which the circuit pattern is formed while performing the above processes, and thus a cleaning process may be performed to remove the foreign materials.

Recently, a supercritical fluid is used in a cleaning process or a developing process of the substrate. For example, the cleaning process may be performed by supplying an isopropyl alcohol (IPA) to a top surface of a substrate to clean thereof, and then supplying a carbon dioxide (CO2) in a supercritical phase to the top surface of the substrate to remove the IPA remaining on the substrate.

In the process using the supercritical fluid, a vessel is used to provide a treating space in which the process fluid may be maintained at a high temperature and a high pressure supercritical phase. The treating space of the vessel must be maintained above a critical temperature and a critical pressure of the carbon dioxide when, for example, supplying carbon dioxide (CO2) in the supercritical phase to a top surface of the substrate. When the treating space is maintained at above the critical temperature and the critical pressure, the wafer supported on a support member may not be maintained in a horizontal state in the treating space. The present inventor(s) recognized that there is currently no way to directly measure the horizontality of the wafer supported on the substrate support member inside the vessel.

SUMMARY

Embodiments of the inventive concept provide a method for storing a substrate type sensor unit which measures a horizontality of a substrate support member located inside a vessel providing a high temperature and a high pressure atmosphere during a process using a supercritical fluid to treat a substrate (i.e., a wafer) and during an idle state, and a buffer member for storing the substrate type sensor.

Embodiments of the inventive concept provide a method for storing a substrate type sensor unit which measures a horizontality in a resolution of 0.1 deg or less, when measuring a horizontal state of a substrate support member located inside a vessel providing a high temperature and a high pressure atmosphere during a process using a supercritical fluid to treat a substrate (i.e., a wafer) and during an idle state, and a buffer member for storing the same.

An object of the inventive concept is not limited thereto, and other objects not mentioned may be clearly understood by those skilled in the art from the following description.

According to an embodiment of the present invention, a buffer unit for temporarily storing a substrate comprises: a housing having a space for storing a substrate therein; one or more slots disposed within the housing for placing a substrate thereon; and a holding unit disposed at a bottom portion of the housing, having a flat and non-inclined top surface, and comprising a built-in wireless charging module. A substrate type sensor is stored at the holding unit.

In an embodiment, the holding unit further comprises a level sensor for measuring a degree of inclination of the top surface of the holding unit.

In an embodiment, the buffer unit is disposed between an index module and a transfer apparatus of a treating module, and the treating module includes an apparatus for treating the substrate at a temperature higher than a room temperature.

In an embodiment, the substrate type sensor comprises: a substrate shaped-member; a level measuring member provided at the substrate shaped-member; a reception unit for receiving a data from the level measuring member; and a power unit for providing a power to the level measuring member and the reception unit, and wherein the power unit is charged by the wireless charging module.

In an embodiment, the substrate type sensor is a sensor for measuring a degree of a horizontality of a support member supporting a substrate under a temperature varying atmosphere, and the level measuring member is provided at the substrate shaped-member and comprises at least one sensor which is a 3-axis or more acceleration sensor or a 6-axis or more inertia measurement unit (IMU).

In an embodiment, the substrate type sensor is zero adjusted while being supported by the holding unit.

In an embodiment, the substrate shaped-member has a substantially same physical size with a size of the substrate.

In an embodiment, the buffer unit further comprises a transmission unit transmitting the data received by the reception unit to the outside.

In an embodiment, the at least one sensor comprises a plurality of sensors, and two opposite sensors are arranged such that a center point of the substrate type-member is on a line defined by connecting the two opposite sensors.

In an embodiment, the at least one sensor of the level measuring member generates an intrinsic error varying according to a temperature.

An embodiment of the inventive concept provides a method for measuring a horizontality of a support member supporting a substrate by using a substrate type sensor. The substrate type sensor comprises: a substrate shaped-member; a level measuring member provided at the substrate shaped-member; a reception unit for receiving a collected data from the level measuring member; and a power unit for providing a power to the level measuring member and the reception unit, and, the method comprises: zero adjusting the substrate type sensor while the substrate type sensor is held by the holding unit of the buffer unit of claim 1; and placing the substrate type sensor on the support member; and the method determines whether the support member is horizontal based on a collected data from the substrate type sensor.

In an embodiment, the substrate type sensor measures the horizontality of the support member supporting the substrate under a temperature varying atmosphere, and the level measuring member comprises at least one sensor comprised of a 3-axis or more acceleration sensor or a 6-axis or more IMU, and the placing the substrate type sensor on the support member comprises: placing the substrate type sensor at a first angle at the support member; and, receiving a collected data as a first data from the substrate type sensor placed on the support member at the first angle; placing the substrate type sensor at a second angle different to the first angle at the support member; and receiving a collected data as a second data from the substrate type sensor placed on the support member at the second angle, and wherein the method determines whether the support member is horizontal by comparing the first data and the second data.

In an embodiment, the sensor is a 6-axis or more IMU, each of the first data and the second data comprises a Roll (Level X) and a Pitch (Level Y), and the comparing the first data and the second data comprises comparing respective elements of the first data and the second data, and the method determines: when the respective elements of the first data and the second data lies within a set range, the support member is horizontal state; and when respective elements of the first data and the second data lies outside the set range, the support member is not horizontal state.

In an embodiment, the sensor is a 6-axis or more IMU, each of the first data and the second data includes a Roll (Level X) and a Pitch (Level Y), and the first data comprises an element of (Level X1, Level Y1), the second data comprises an element of (Level X2, Level Y2), the sensor generates an intrinsic error varying according to a temperature, and an inclination of the support member measured by the substrate type sensor unit is calculated by a non-transitory computer-readable medium storing program codes executable by a processor as an element including (Level Xa, Level Ya), when the first angle is defined as 0 degrees (deg), the second angle is 180 degrees (deg): the level Xa is (Level X1−Level X2)/2, and the level Ya may be calculated as (Level Y1−Level Y2)/2.

In an embodiment, the substrate type sensor comprises a plurality of sensors, and any two opposing sensors are arranged such that a center point of the substrate type-member is on a line defined by connecting the two opposing sensors, the first data and the second data are received from the two opposing sensors, respectively, whether the support member is horizontal is determined by comparing the first data and the second data received from one sensor of the two opposing sensors, and a validity of a determination by the one sensor is determined by comparing the first data and the second data received from the other sensor of the two opposing sensors.

In an embodiment, the support member is provided at a high pressure vessel of a substrate treating apparatus using a supercritical fluid, and the support member comprises a plurality of support pins spacing the substrate apart from a plane of the support member, and the sensor is located at a position corresponding to a position of one or more of the support pins at the first angle and the second angle.

In an embodiment, the first data includes an element of X1, Y1, and Z1, and the second data as an element of X2, Y2, and Z2, and the comparing the first data and the second data comprises respective elements of the first data and the second data, the method determines: when the respective elements of the first data and the second data lies within a set range, the support member is horizontal state; and when respective elements of the first data and the second data lies outside the set range, the support member is not horizontal state.

An embodiment of the inventive concept provides a substrate type sensor storing method. The substrate type sensor storing method comprises: providing a holding unit at a bottom portion of a buffer unit, the holding unit having a flat and non-inclination top surface and comprising a built-in wireless charging module, the buffer unit temporarily storing a substrate; and storing a substrate type sensor at the holding unit.

In an embodiment, the substrate type sensor is zero adjusted while being supported by the holding unit.

In an embodiment, the substrate type sensor comprises a power unit providing power to each configuration of the substrate type sensor, and the power unit is charged by a wireless charging module.

In an embodiment, the holding unit further comprises a level sensor for measuring an inclination of an upper surface of the holding unit.

The purpose of the inventive concept is to provide a substrate treating apparatus and a substrate treating method capable of easily replacing an atmosphere in a processing chamber in which a substrate is treated using a supercritical fluid when treating a substrate using the supercritical fluid.

The purpose of the inventive concept is not limited thereto, and other objectives not mentioned will be clearly understood by those skilled in the art from the following statements.

Embodiments of the inventive concept provide a substrate treating apparatus. In an embodiment, the apparatus comprises: a liquid treating chamber for liquid-treating a substrate therein; a drying chamber for dry-treating the liquid-treated substrate; a transfer device for transferring the substrate between the liquid treating chamber and the drying chamber; and a controller for controlling the liquid treating chamber and the transfer device, wherein the transfer device comprises: a transfer robot having a hand for placing the substrate thereon; and a heating member for heating the substrate, and wherein the controller controls the transfer device such that the heating member of the transfer device heats a liquid on the substrate to a first temperature before the transfer device transfers the substrate taken out from the liquid treating chamber to the drying chamber.

In an embodiment, the heating member is a heater provided at the hand.

According to an embodiment of the inventive concept, a substrate type sensor unit capable of measuring a horizontal state of the substrate support member located inside a vessel providing a high temperature and a high pressure atmosphere during a process using a supercritical fluid to treat a substrate (i.e., a wafer) and during an idle state, may be efficiently stored.

According to an embodiment of the inventive concept, a substrate type sensor unit for measuring of a horizontal in units of 0.1 deg or less, when measuring a horizontal state of a substrate support member located inside a vessel providing a high temperature and a high pressure atmosphere during a process using a supercritical fluid to treat a substrate (i.e., a wafer) and during an idle state, may be efficiently stored.

The effects of the inventive concept are not limited to the above-described effects, and the effects not mentioned may be clearly understood by those of ordinary skill in the technical field to which the inventive concept belongs from this specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
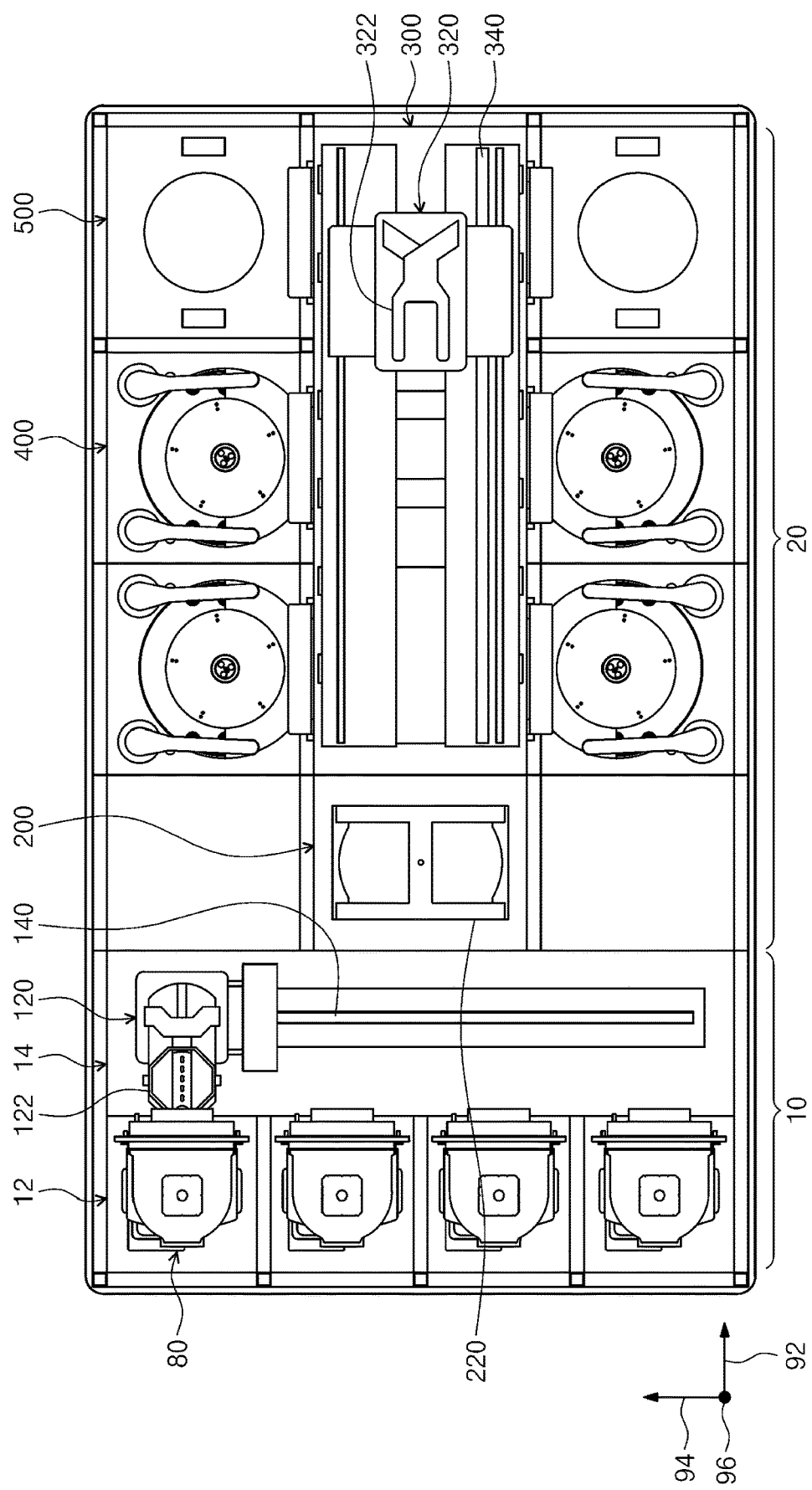
FIG. 1 is a top-plan view schematically illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

FIG. 1 illustrates a substrate treatment system according to an embodiment of the inventive concept.

Referring to FIG. 1, the substrate treatment system comprises an index module 10, a treating module 20, and a controller 30. According to an embodiment, the index module 10 and the treating module 20 are sequentially arranged. Hereinafter, a direction in which the index module 10 and the treating module 20 are arranged will be referred to as a first direction 92. A direction that is perpendicular to the first direction 92 when viewed from above will be referred to as a second direction, and a direction that is perpendicular to both the first direction 92 and the second direction 94 will be referred to as a third direction 96.

The index module 10 returns the wafer W from a container 80 where the wafer W is stored to the treating module 20, and gets the processed wafer W from the treating module 20 to be stored in the container 80. The index module 10 is disposed with its length extending along the second direction 94. The index module 10 has a load port 12 and an index frame 14. The index frame 14 is disposed between the load port 12 and the treating module 20. The container 80 in which the wafers W are stored is placed on the load port 12. A plurality of load ports 12 may be provided, and the plurality of load ports 12 may be disposed along the second direction 94.

For the container 80, a closing-type container such as the Front Open Unified Pod (FOUP) can be used. The container 80 can be placed on the load port 12 by an overhead transfer, an overhead conveyor, an automatic guided vehicle, or by an operator.

The index frame 14 is provided with an index robot 120. In the index frame 14, a guide rail 140 is provided with its length extending along the second direction 94, and the index robot 120 may be provided movable on the guide rail 140. The index robot 120 includes a hand 122 on which the wafer W is placed, and the hand 122 can be provided forwardly and backwardly movable, rotatable with the third direction 96 as an axis, and movable along the third direction 96. A plurality of hands 122 are provided vertically placed apart, and the hands 122 can be forwardly and backwardly movable independent of each other.

The treating module 20 includes a buffer unit 200, a transfer apparatus 300, a liquid treating apparatus 400, and a supercritical treating apparatus 500. The buffer unit 200 provides a temporary space for the wafer W being brought into the treating module 20 and the wafer W being taken from the treating module 20. The liquid treating apparatus 400 supplies liquid to the wafer W to perform a liquid treatment process on the wafer W. The supercritical treating apparatus 500 performs a drying process to remove the liquid remaining on the wafer W. The transfer apparatus 300 transfers the wafer W between the buffer unit 200, the liquid treating apparatus 400, and the supercritical treating apparatus 500.

The transfer apparatus 300 may be arranged with its length extending along the first direction 92. The buffer unit 200 can be placed between the index module 10 and the transfer apparatus 300. The liquid treating apparatus 400 and supercritical treating apparatus 500 may be disposed on a side of the transfer unit 300. The liquid treating apparatus 400 and the transfer apparatus 300 may be disposed along the second direction 94. The supercritical treating apparatus 500 and the transfer apparatus 300 may be disposed along the second direction 94. The buffer unit 200 may be located at one end of the transfer apparatus 300.

In an embodiment, the liquid treating apparatus 400 may be disposed on both sides of the transfer apparatus 300, the supercritical treating apparatus 500 may be disposed on both sides of the transfer apparatus 300, and the liquid treating apparatus 400 may be disposed closer to the buffer unit 200 than the supercritical treating apparatus 500. On one side of the transfer apparatus 300, liquid treating apparatus 400 may be provided in an array of A×B (A, B are natural numbers greater than 1 or 1) along the first direction 92 and third direction 96. In addition, on one side of the transfer apparatus 300, supercritical treating apparatus 500 may be provided in an array of C×D (C, D are natural numbers greater than 1 or 1) along the first direction 92 and the third direction 96 respectively. Unlike the aforementioned, only liquid treating apparatus 400 may be provided on one side of the transfer apparatus 300 and only supercritical treating apparatus 500 may be provided on the other side.

The transfer apparatus 300 has a transfer robot 320. Within the transfer device 300, a guide rail 340 is provided with its length extending along the first direction 92 and the transfer robot 320 may be provided movable on the guide rail 340. The transfer robot 320 includes a hand 322 on which the wafer W is placed, and the hand 322 may be provided forwardly and backwardly movable, rotatable with the third direction 96 as an axis, and movable along the third direction 96. A plurality of hands 122 are provided vertically placed apart, and the hands 122 can be forwardly and backwardly movable independent of each other.

The buffer unit 200 has a plurality of slots 224 on which the wafers W are placed. The buffers 220 may be provided placed apart from each other along the third direction 96. The buffer unit 200 has an open front side and an open rear side. The front side faces the index module 10, and the rear side faces the transfer apparatus 300. The index robot 120 can access the buffer unit 200 through the front side and the transfer robot 320 can access the buffer unit 200 through the rear side.

Figure 2:
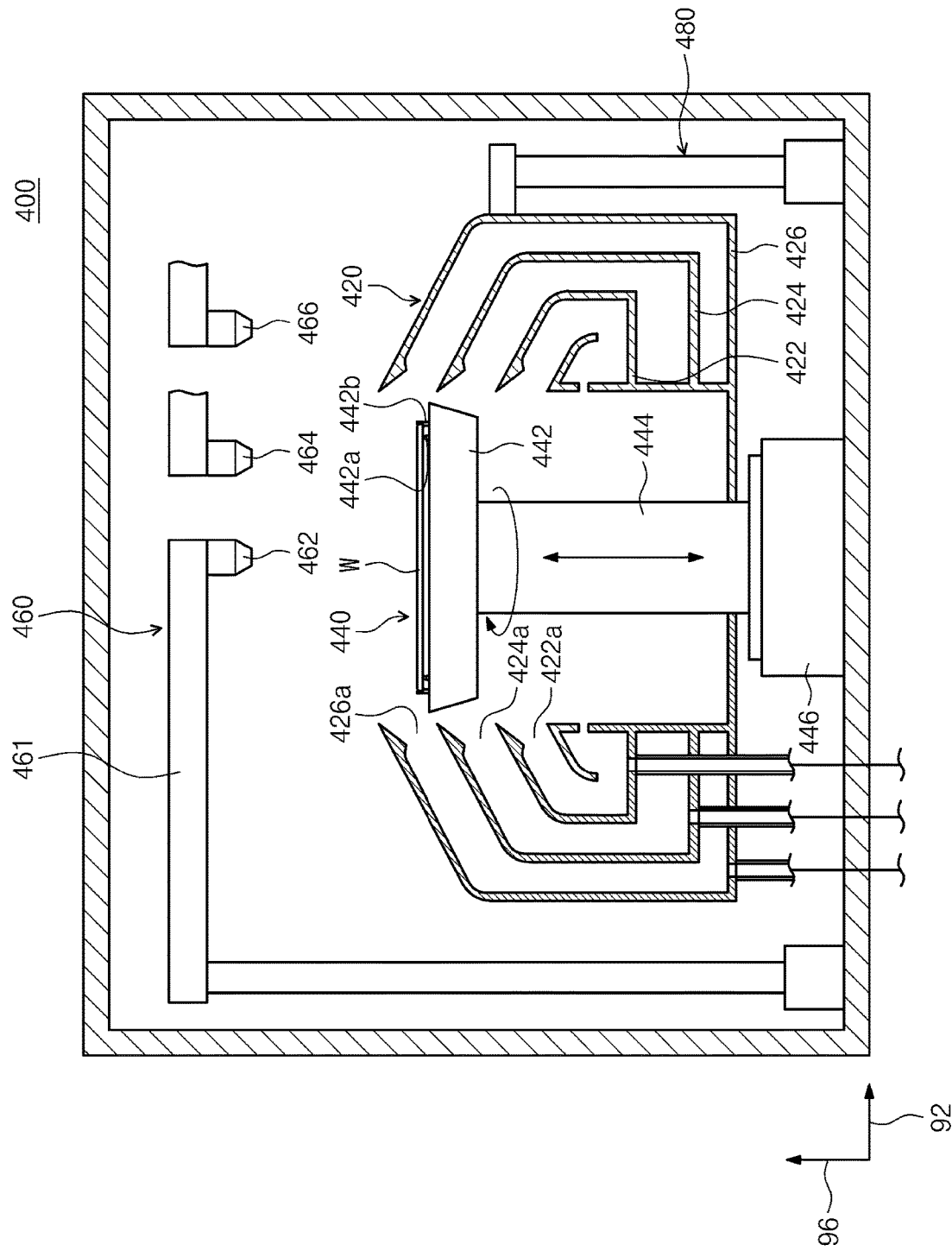
FIG. 2 is a view schematically illustrating an embodiment of a liquid treating chamber of FIG. 1.

FIG. 2 illustrates an embodiment of the liquid treating apparatus 400 in FIG. 1. Referring to FIG. 2, the liquid treating apparatus 400 has a housing 410, a cup 420, a support unit 440, a liquid supply unit 460, a lifting/lowering unit 480, and a controller 40. The controller 40 controls the operation of the liquid supply unit 460, the support unit 440, and the lifting/lowering unit 480. The housing 410 is generally provided in a rectangular parallelepiped shape. The cup 420, the support unit 440, and the liquid supply unit 460 are located in the housing 410.

The cup 420 has a treating space with an open upper portion, and the wafer W is liquid treated within the treating space. The support unit 440 supports the wafer W within the treating space. The liquid supply unit 460 supplies the liquid onto the wafer W supported by the support unit 440. Liquid can be provided in multiple types, and supplied sequentially onto the wafer W. The lifting/lowering unit 480 adjusts the relative level between the cup 420 and the support unit 440.

In an embodiment, the cup 420 has a plurality of collecting bowls 422, 424, and 426. Each of the collecting bowls 422, 424, and 426 has a collecting space to collect the liquid used to process the substrate. Each collecting bowl 422, 424, and 426 is provided in a ring shape surrounding the support unit 440. When the liquid treatment process is carried out, the treatment liquid scattered due to the rotation of the wafer W flows into the collecting space through the inlets 422a, 424a, and 426a of each collecting bowl 422, 424, and 426. In an embodiment, the cup 420 has a first collecting bowl 422, a second collecting bowl 424, and a third collecting bowl 426. The first collecting bowl 422 is disposed to surround the support unit 440, the second collecting bowl 424 is disposed to surround the first collecting bowl 422, and the third collecting bowl 426 is disposed to surround the second collecting bowl 424. The second inlet 424a that flows liquid into the second collecting bowl 424 may be located above the first inlet 422a that flows liquid into the first collecting bowl 422, and the third inlet 426a that flows liquid into the third collecting bowl 426 may be located above the second inlet 424a.

The support unit 440 has a support plate 442 and a drive shaft 444. The upper surface of the support plate 442 is generally provided in a disc shape and may have a diameter greater than the wafer W. At the center of the support plate 442, a support pin 442a is provided to support the bottom surface of the wafer W, and an upper end of the support pin 442a is provided to protrude from the support plate 442 so that the wafer W is placed apart from the support plate 442. A chuck pin 442b is provided at the edge of the support plate 442. The chuck pin 442b is provided to protrude upwards from the support plate 442, supporting (abutting) the side of the wafer W so that when the wafer W is rotated, the wafer W does not deviate from the support unit 440. The drive shaft 444 is driven by a driving member 446 and is connected to the center of the bottom surface of the wafer W and rotates the support plate 442 relative to its center axis.

In an embodiment, the liquid supply unit 460 has a first nozzle 462, a second nozzle 464, and a third nozzle 466. The first nozzle 462 supplies a first liquid onto the wafer W. The first liquid may be the liquid that removes a layer or foreign substances remaining on the wafer W. The second nozzle 464 supplies a second liquid onto the wafer W. The second liquid may dissolve well in a third liquid. For example, the second liquid may dissolve better in the third liquid than in the first liquid. The second liquid may neutralize the first liquid supplied on the wafer W. In addition, the second liquid may neutralize the first liquid and at the same time dissolve better in the third liquid compared to the first liquid. In an embodiment, the second liquid can be water. The third nozzle 466 supplies the third liquid onto the wafer W. The third liquid may dissolve well in the supercritical fluid used in the supercritical treating apparatus 500. For example, the third liquid may dissolve better in the supercritical fluid used in the supercritical treating apparatus 500 compared to the second liquid. In an embodiment, the third liquid can be an organic solvent. The organic solvent may be isopropyl alcohol (IPA). In an embodiment, the supercritical fluid can be carbon dioxide. The first nozzle 462, the second nozzle 464, and the third nozzle 466 are supported by a different arm 461 and these arms 461 can be moved independently. Selectively, the first nozzle 462, the second nozzle 464, and the third nozzle 466 may be installed on the same arm and move simultaneously.

The lifting/lowering unit 480 moves the cup 420 in an up/down direction. The relative level between the cup 420 and the wafer W is changed by the up/down movement of the cup 420. As a result, the collecting bowl 422, 424, and 426 that collects the treatment liquid changes depending on the type of liquid supplied to the substrate W, so the liquids can be separately collected. Unlike the aforementioned, the cup 420 is fixedly installed and the lifting/lowering unit 480 can move the support unit 440 in an up/down direction.

Figure 3:
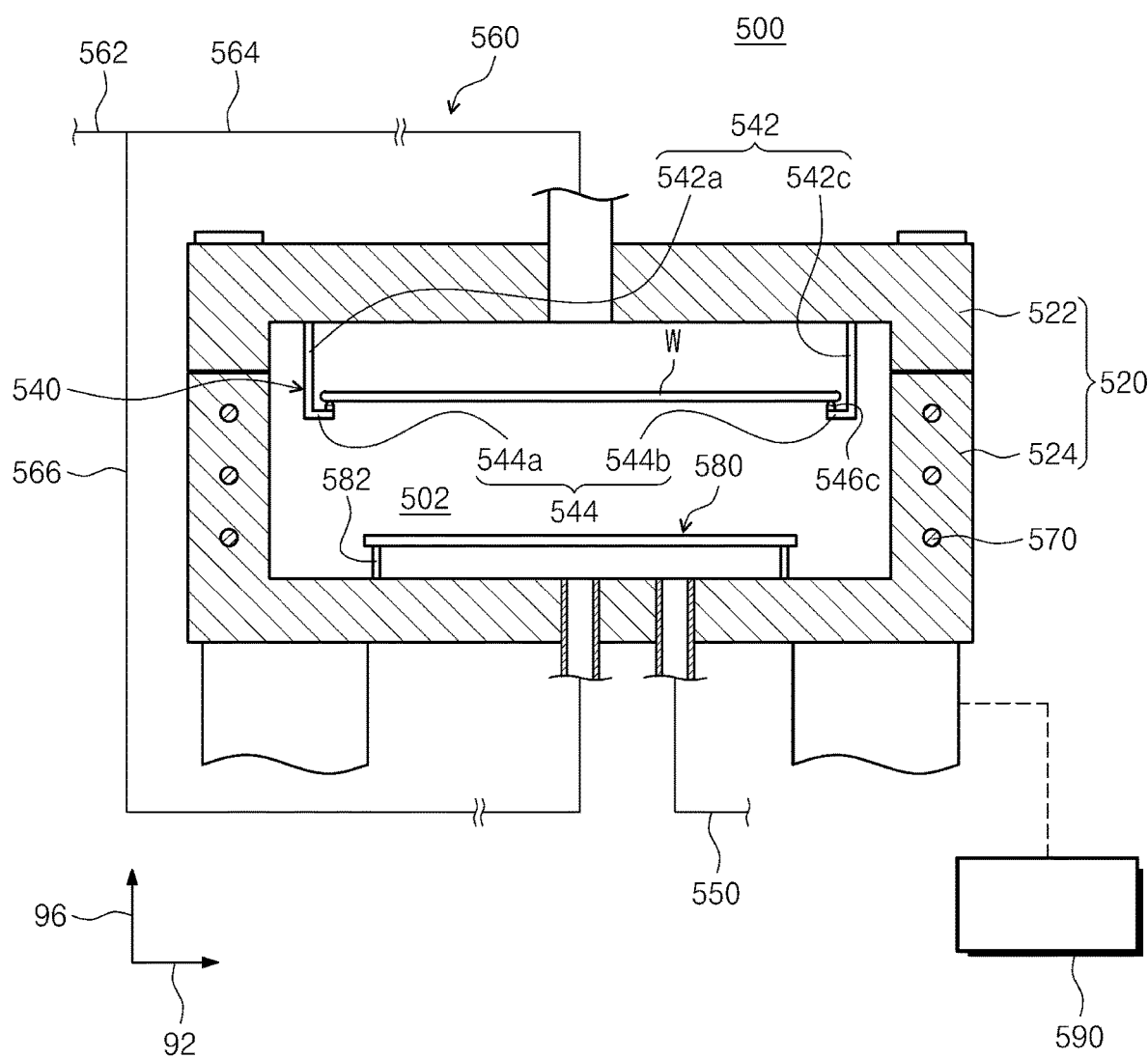
FIG. 3 is a view schematically illustrating an embodiment of a supercritical treating chamber of FIG. 1.

FIG. 3 is a view schematically illustrating an embodiment of the supercritical treating apparatus 500 of FIG. 1. According to an embodiment, the supercritical treating apparatus 500 removes the liquid on the wafer W using the supercritical fluid. The supercritical treating apparatus 500 includes a vessel 520, a support member 540, a fluid supply unit 560, and a blocking plate 580.

The vessel 520 provides a treating space 502 in which a supercritical process is performed. The vessel 520 has an upper vessel (upper body) 522 and a lower vessel (lower body) 524, and the upper vessel 522 and the lower vessel 524 are combined with each other to provide the above-described treating space 502. The upper vessel 522 is provided above the lower vessel 524. A position of the upper vessel 522 may be fixed, and the lower vessel 524 may be lifted and lowered by a driving member 590 such as a cylinder. When the lower vessel 524 is spaced apart from the upper vessel 522, the treating space 502 is opened, and at this time, the wafer W is taken in or taken out. During the process, the lower vessel 524 is in close contact with the upper vessel 522, so that the treating space 502 is sealed from the outside. The supercritical treating chamber 500 has a heater 570. In an embodiment, the heater 570 is located inside a wall of the vessel 520. In an embodiment, the heater 570 may be provided at least one of an upper vessel 522 or a lower vessel 524 composing the vessel 520. The heater 570 heats the treating space 502 of the vessel 520 so that the fluid supplied into the treating space 502 of the vessel 520 maintains a supercritical state. The treating space 502 has an atmosphere formed by a supercritical fluid.

The support member 540 supports the wafer W in the treating space 502 of the vessel 520. The support member 540 includes a fixing rod 542 and a holder 544. The fixing rod 542 may be fixedly installed in the upper vessel 522 to downwardly protrude from a bottom surface of the upper vessel 522. The fixing rod 542 may be provided with its lengthwise direction in an up/down direction. A plurality of fixing rods 542 are provided and may be spaced apart from each other. The fixing rods 542 are disposed so that the wafer W does not interfere with the fixing rods 542 when the wafer W is taken in or taken out into the space surrounded by them. The holder 544 is coupled to each of the fixing rods 542. The holder 544 extends laterally from a lower end of the fixing rod 542. In one embodiment, the holder 544 extends in a shape capable of supporting a back side circumference of the wafer W.

The fluid supply unit 560 supplies the process fluid to the treating space 502 of the vessel 520. In an embodiment, the process fluid may be supplied to the treating space 502 in a supercritical phase. Unlike this, the process fluid is supplied to the treating space 502 in a gas phase, and may be phase-changed to the supercritical phase in the treating space 502. In an embodiment, the fluid supply unit 560 has a main supply line 562, a top branch line 564, and a bottom branch line 566. The top branch line 564 and the bottom branch line 566 branch from the main supply line 562. The top branch line 564 is coupled to the upper vessel 522 to supply a cleaning fluid from above a top portion of the wafer W placed on the support member 540. In an embodiment, the top branch line 564 is coupled to a center of the upper vessel 522. The bottom branch line 566 is coupled to the lower vessel 524 to supply the cleaning fluid from under the wafer W placed on the support member 540. In an embodiment, the bottom branch line 566 is coupled to the center of the lower vessel 524. The exhaust unit 550 is coupled to the lower vessel 524. The supercritical fluid in the treating space 502 of the vessel 520 is exhausted to an outside of the vessel 520 through the exhaust unit 550.

A blocking plate 580 may be disposed in the treating space 502 of the vessel 520. The blocking plate 580 may be provided in a disk shape. The blocking plate 580 is supported by the support 582 to be spaced upward from the bottom surface of the vessel 520. A plurality of supports 582 are provided in a rod shape, and are disposed so as to be spaced apart from each other by a predetermined distance. When viewed from above, the blocking plate 580 may be provided to overlap a discharge port of the bottom branch line 566 and an inlet of the exhaust unit 550. The blocking plate 580 may prevent the wafer W from being damaged by directly discharging the cleaning fluid supplied through the bottom branch line 566 toward the wafer W.

Figure 4:
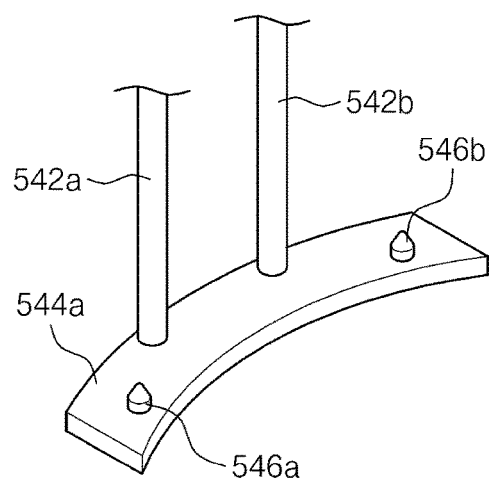
FIG. 4 is a perspective view schematically illustrating an embodiment of a substrate support member provided at the supercritical treating chamber of FIG. 3.
Figure 4:
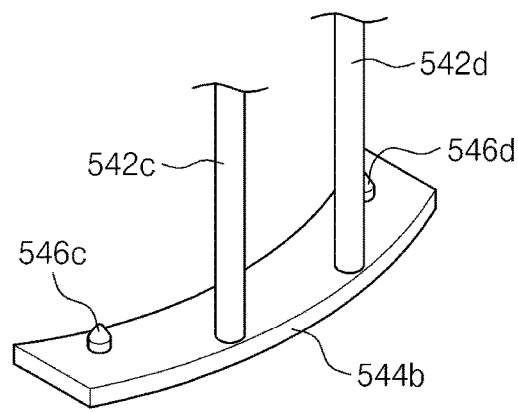

FIG. 4 is a perspective view illustrating an embodiment of the support member 540 provided in the supercritical treating chamber of FIG. 3. The support member 540 according to an embodiment will be described in more detail with reference to FIG. 4.

The support member 540 includes a fixing rod 542 and a holder 544. The fixing rod 542 may be fixedly installed in the upper vessel 522 to protrude downward from the bottom surface of the upper vessel 522. The fixing rod 542 may be provided in a longitudinal direction thereof in a vertical direction. According to an embodiment, a plurality of fixing rods 542 are provided and may be spaced apart from each other. In an embodiment, the fixing rod 542 includes a first fixing rod 542a, a second fixing rod 542b, a third fixing rod 542c, and a fourth fixing rod 542d. A plurality of holders 544 are provided and may be spaced apart from each other. In an embodiment, the holder 544 includes a first holder 544a and a second holder 544b. The first fixing rod 542a and the second fixing rod 542b are coupled to the first holder 544a. The third fixing rod 542c and the fourth fixing rod 542d are coupled to the second holder 544b. The first fixing rod 542a and the second fixing rod 542b are located adjacent to each other, and the third fixing rod 542c and the fourth fixing rod 542d are located adjacent to each other. A space between the first fixing rod 542a and the third fixing rod 542c is formed to have a width through which the wafer W may pass. The first fixing rod 542a and the third fixing rod 542c are spaced apart from each other such that the wafer W may pass through therebetween. Likewise, the second fixing rod 542b and the fourth fixing rod 542d may be spaced apart from each other such that the wafer W passes through therebetween The first holder 544a may be provided in an arc shape having a predetermined central angle. A first support pin 546a and a second support pin 546b are provided on a top surface of the first holder 544a to be spaced apart from each other by a predetermined distance. The first support pin 546a and the second support pin 546b protrude from the top surface of the first holder 544a by a predetermined height. As the separation distance between the first support pin 546a and the second support pin 546b is provided longer, the wafer W may be stably supported, but this may be set differently depending on a design.

The second holder 544b may be provided in an arc shape having a predetermined central angle. The third support pin 546c and the fourth support pin 546d are provided on a top surface of the second holder 544b to be spaced apart from each other by a predetermined distance. The third support pin 546c and the fourth support pin 546d are formed to protrude at a predetermined height from the top surface of the second holder 544b. As the separation distance between the third support pin 546c and the fourth support pin 546d is provided longer, the wafer W may be stably supported, but this may be set differently depending on a design.

The first support pin 546a, the second support pin 546b, the third support pin 546c, and the fourth support pin 546d allow the wafer W to be spaced apart from the top surface of the holder 544 by a predetermined distance. The support pins 546 are in point contact with the wafer W to reduce a contamination of the wafer W due to an increase in the contact area. As an example, only four supporting pins are illustrated in FIG. 4, two, three, or more than four supporting pins may be provided. The support pins 546 must be maintained without deformation in a high temperature and a high pressure environment. In an embodiment, the support pins 546 may be made of a same material as the holder 544.

Due to the above-described structure, the edge region of the wafer W brought into the treating space 502 of the vessel 520 is placed on the support pins 546 of the holder 544, and a part of an edge region of an entire top surface of the wafer W, a center region of the bottom surface of the wafer W, and the bottom surface of the wafer W is exposed to the process fluid supplied to the treating space 502.

The ends of the support pins 546 supporting the wafer W should have constant heights. The height of each of the support pins 546 may vary depending on whether the holder 544 is horizontal and the degree of coupling between the fixing rod 542 and the upper vessel 522. In addition, in a process of opening the vessel 520, the heights of uppermost ends of the support pins 546 may be different by the ascending and descending motion of the lower vessel 524. For various reasons other than the above-described reasons, the heights of the uppermost ends of the support pins 546 may be different. However, the wafer W supported by the upper ends of the support pins 546 may be horizontally maintained only when the uppermost heights of the support pins 546 are set to be the same. Whether the uppermost heights of the support pins 546 are the same may be measured through a water drop gauge, but this has a severe error range and does not confirm that the uppermost heights of the support pins 546 are the same during the process.

Figure 5:
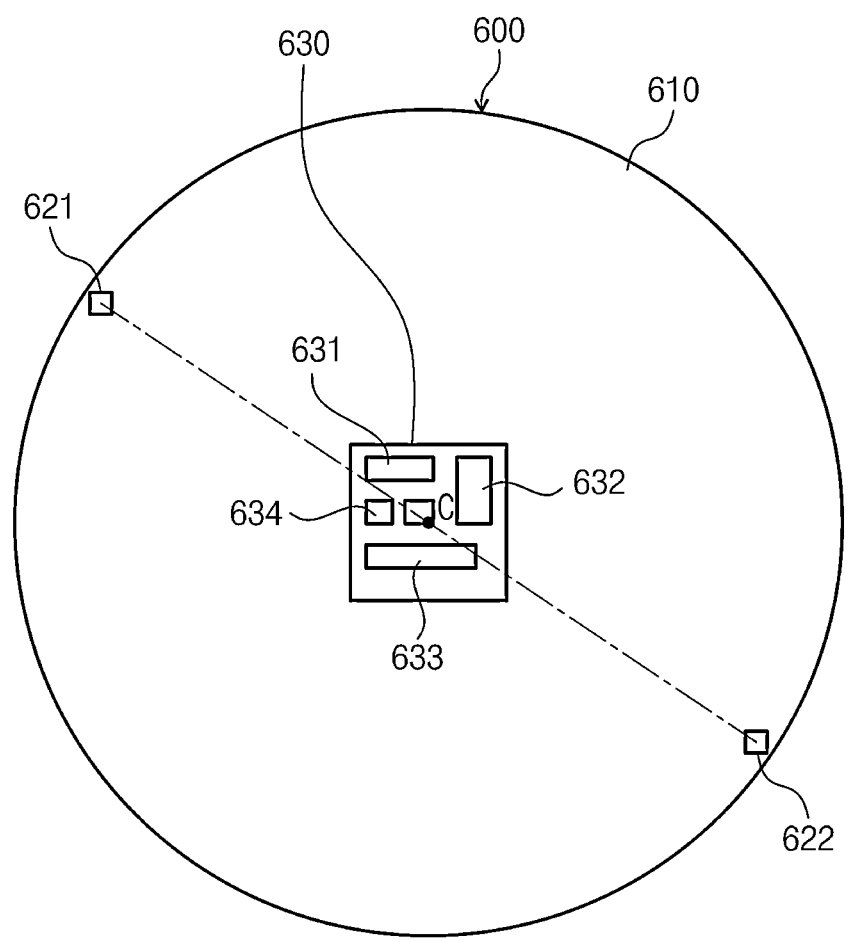
FIG. 5 is a top plan view of a substrate type sensor unit according to an embodiment of the inventive concept.
Figure 6:
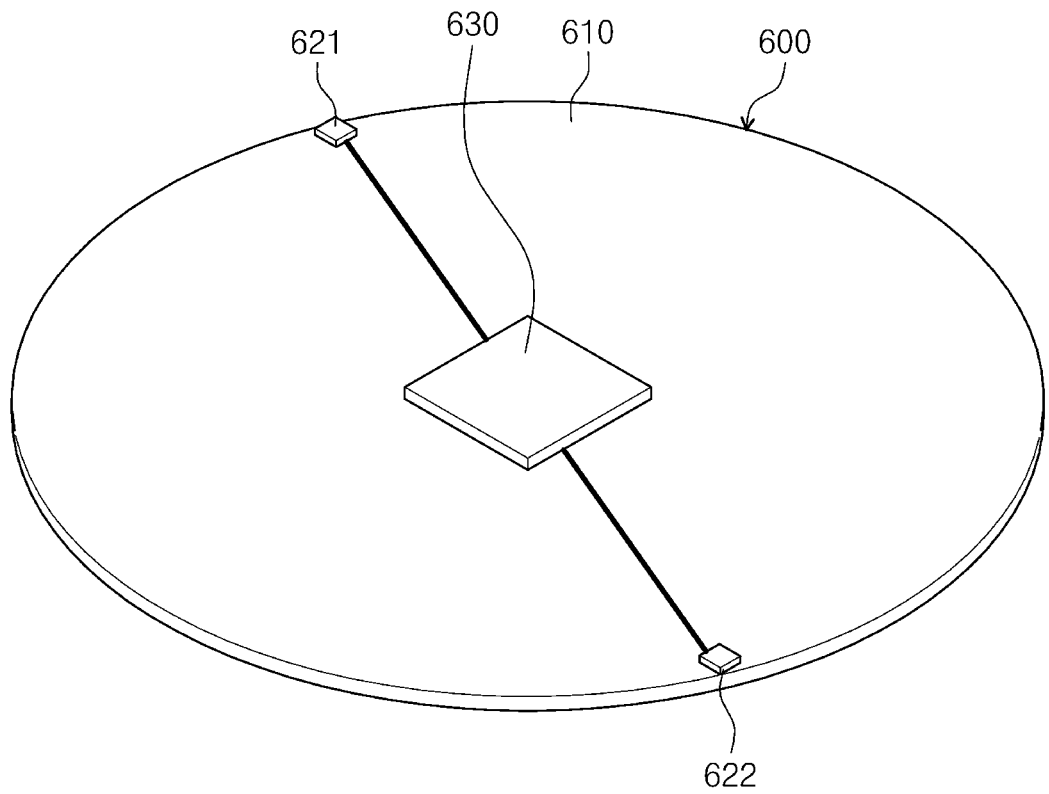
FIG. 6 is a perspective view of the substrate type sensor unit according to an embodiment of the inventive concept of FIG. 5.

FIG. 5 is a top plan view of a substrate type sensor unit 600 according to an embodiment of the inventive concept. FIG. 6 is a perspective view of a substrate type sensor unit according to an embodiment of the inventive concept of FIG. 5. A substrate type sensor unit 600 according to an embodiment will be described with reference to FIG. 5 and FIG. 6. When the substrate type sensor unit 600 according to an embodiment of the inventive concept is used, it may be measured whether the wafer W may be horizontally supported by the support member 540. For example, the substrate type sensor unit 600 may measure an uppermost height difference between the support pins 546 in a resolution of 0.1 deg or less, and may check whether the uppermost heights of the support pins 546 are the same during the process.

The substrate type sensor unit 600 includes a substrate shaped member 610. The substrate shaped member 610 is provided to have a physical size substantially the same as or similar to a size of the substrate to be treated.

The substrate type sensor 600 includes one or more sensors. The sensor is provided as an acceleration sensor of at least three axes or an Inertia Measurement Unit (IMU) of at least six axes.

Acceleration sensors are known techniques that measure how much force an object is receiving based on the Earth's gravitational acceleration. The acceleration sensor decomposes the gravitational acceleration into components of X, Y, and Z axes to display the amount of each axis component. The acceleration sensor may represent the gravitational acceleration as a vector sum of values of X, Y, and Z. Since the value of the acceleration sensor has a specific value even when it is stationary state, a degree of inclination can be determined. In measuring the inclination using the acceleration sensor, the inclination with respect to the x-axis may be expressed as arctan(x/z), and the inclination with respect to the y-axis may be expressed as arctan(y/z).

A 6-axis or more IMU (Inertial Measurement Unit) is a known technology, including a 3-axis gyro sensor in addition to the 3-axis acceleration sensor. The three-axis gyro sensor measures an angular velocity. As referenced from FIG. 14, a roll (Level X), a pitch (Level Y), and a yaw are calculated for the 6-axis or more IMU. In a known IMU, a three-axis geomagnetic sensor may be applied to correct a phenomenon in which a final value of the gyro sensor is drifted.

Figure 7A:
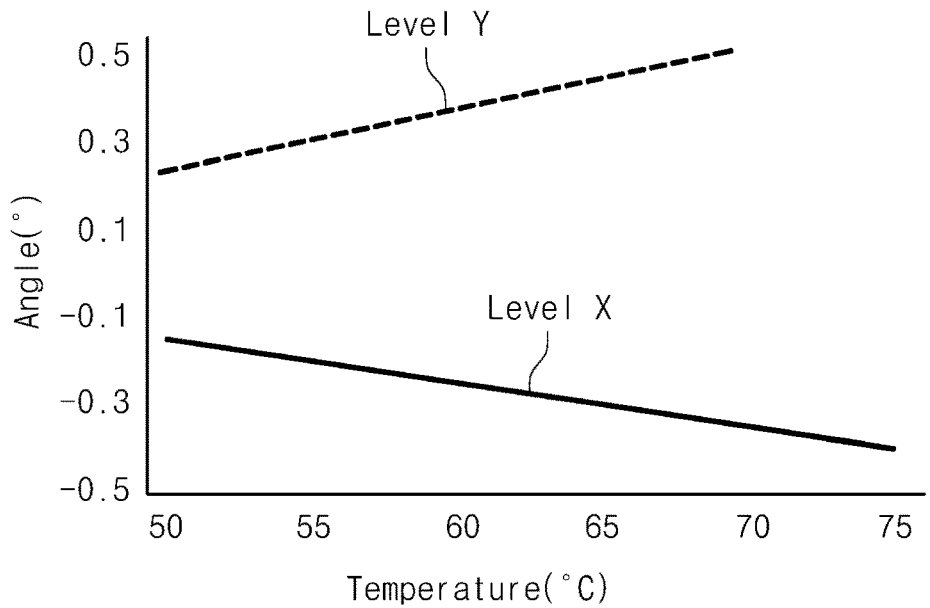
FIG. 7A and FIG. 7B are an exemplary diagram in which a measured value of an IMU changes according to a temperature, FIG. 7A graph is an example of the change in a measured value according to a temperature change of a first IMU, and FIG. 7B graph is an example of a change in a measured value according to a temperature change of a second IMU.
Figure 7B:
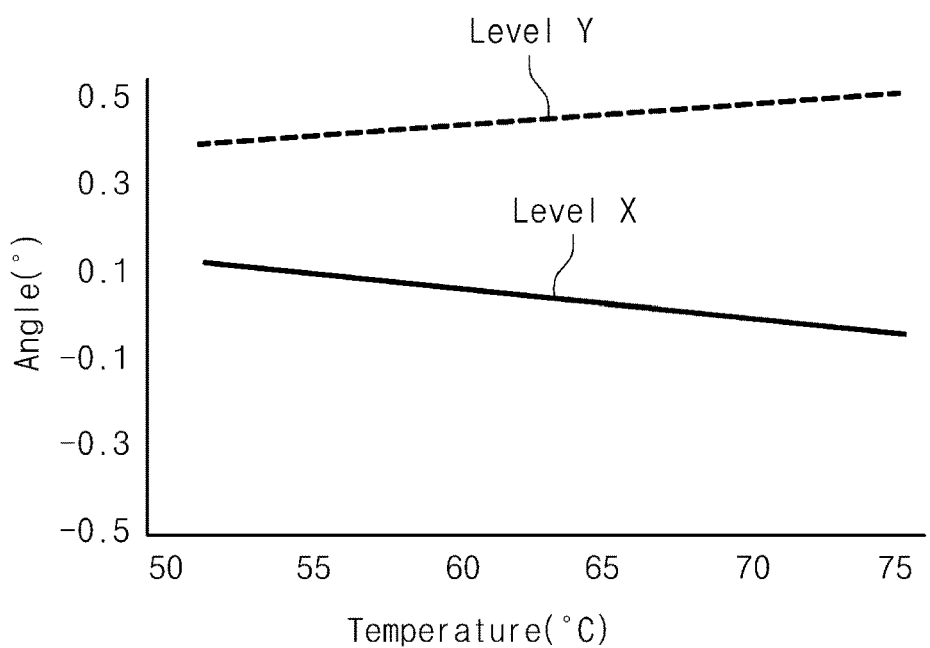

Sensors such as IMU react sensitively to temperature changes and the measured values change, resulting in errors. For example, when a temperature of the IMU increases, the measured value of the IMU may increase. Unlike this, when the temperature of the IMU increases, the measured value of the IMU may decrease. For example, when the temperature of the IMU increases, the measured value decreases together. FIG. 7A and FIG. 7B are an exemplary diagram in which a measured value of an IMU changes according to a temperature, FIG. 7A graph is an example of the change in a measured value according to a temperature change of a first IMU, and FIG. 7B graph is an example of a change in a measured value according to a temperature change of a second IMU. Referring to the FIG. 7A graph and the FIG. 7B graph, the first IMU has a larger variation in measured values with respect to a temperature than the second IMU. According to an embodiment of the inventive concept, despite the measurement error due to a rise of temperature, it is possible to measure whether the wafer W may be horizontally supported by the support member 540.

The sensor provided to the substrate type sensor unit 600 includes a first sensor 621. Furthermore, a second sensor 622 may be further included. The first sensor 621 and the second sensor 622 are IMUs having 6 or more axes. The first sensor 621 and the second sensor 622 may be located at positions opposite to each other with respect to a center C of the substrate type sensor unit 600. The first sensor 621 and the second sensor 622 may be located at opposite edges of the substrate type sensor unit 600. In an embodiment, the first sensor 621 and the second sensor 622 may be disposed to be located above the support pin 546, respectively. In more detail, the first sensor 621 may be located above the first support pin 546a, and the second sensor 622 may be located above the fourth support pin 546d. An angle formed by the first sensor 621 and the second sensor 622 based on the center C of the substrate type sensor unit 600 may be 180 degrees deg.

The substrate type sensor unit 600 includes a central module 630. The central module 630 may include a communication unit 631 that receives a data from the first sensor 621 and/or the second sensor 622, a storage unit 632 that stores the data, a transmission unit 633 that transmits the data, and a power unit 634 that provides a power to each component. The first sensor 621 and the central module 630 may be connected so that the central module 630 receives the data acquired by the first sensor 621. The second sensor 622 and the central module 630 may be connected so that the central module 630 receives the data acquired by the second sensor 622. The transmission unit 632 may be provided as a wireless communication module. An operation to be described later may be performed in an external device through the data transmitted from the transmitter. Alternatively, an operation unit is provided to the central module 630, and an operation to be described later may be performed in the operation unit to transmit an inclination generated by the support member 540 to the external device through the transmission unit. The power supply unit is provided as a wireless chargeable battery.

Figure 8A:
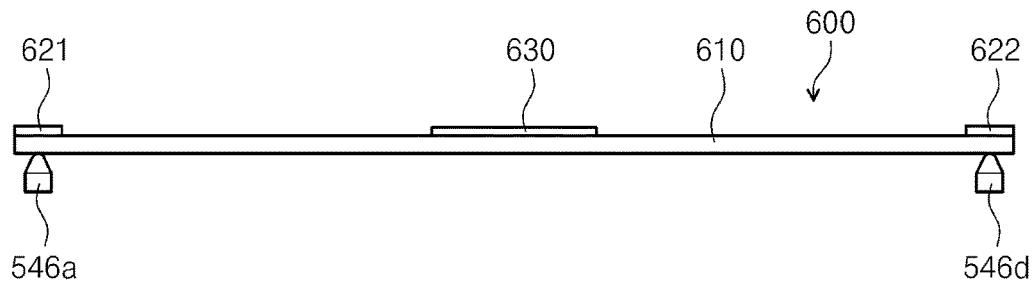
FIG. 8A and FIG. 8B describe a method of measuring whether a support member may horizontally support a wafer using a substrate type sensor unit 600 according to an embodiment of the inventive concept, and will be described when the support member is provided in a state capable of horizontally supporting the wafer.
Figure 8B:
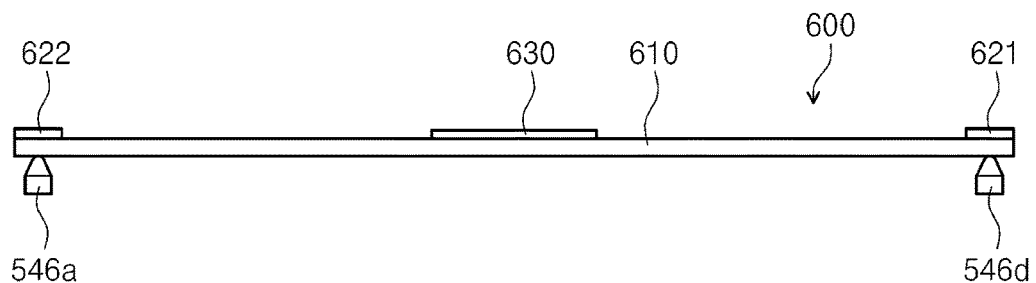
Figure 9A:
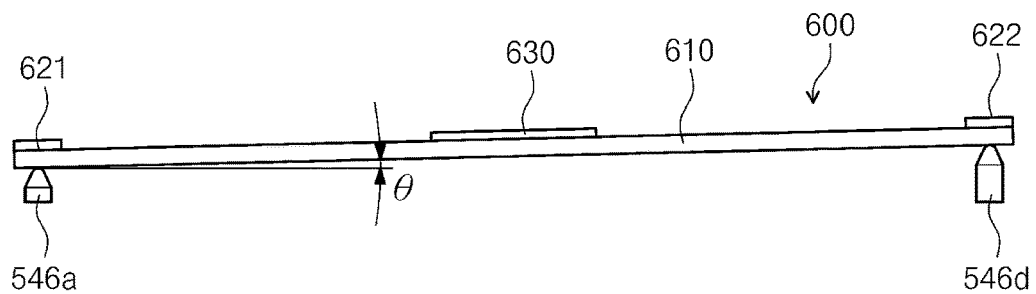
FIG. 9A and FIG. 9B illustrate a method of measuring whether the support member may horizontally support the wafer using a substrate type sensor unit 600 according to an embodiment of the inventive concept, and as an example, in a state in which the support member cannot horizontally support the wafer when inclined by a degree of θ.
Figure 9B:
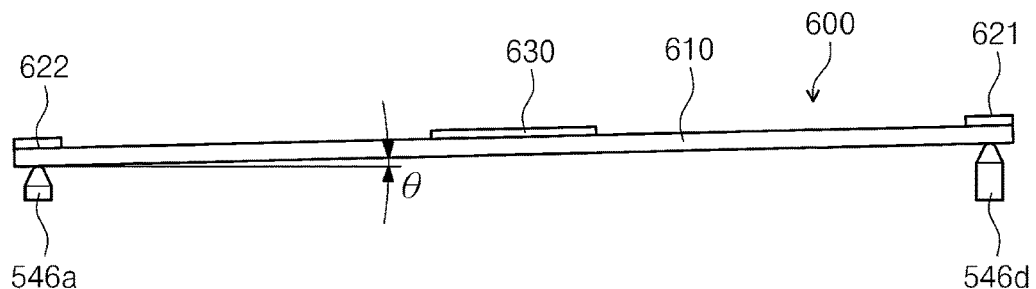

FIG. 8A and FIG. 8B describe a method of measuring whether a support member may horizontally support a wafer using a substrate type sensor unit 600 according to an embodiment of the inventive concept, and will be described when the support member is provided in a state capable of horizontally supporting the wafer. FIG. 9A and FIG. 9B illustrate a method of measuring whether the support member may horizontally support the wafer using a substrate type sensor unit 600 according to an embodiment of the inventive concept, and as an example, in a state in which the support member cannot horizontally support the wafer when inclined by a degree of θ. A horizontal measurement method of the support member using the substrate type sensor unit 600 will be described with reference to FIG. 8A, FIG. 8B, FIG. 9A and FIG. 9B.

According to an embodiment, the substrate type sensor unit 600 includes a first step of measuring an inclination of the support member 540 while provided at a first angle, and a second step of measuring an inclination of the support member 540 while provided at a second angle. The second angle is rotated 180 degrees (deg) from the first angle. FIG. 8A and FIG. 9A illustrate an inclination measurement state according to the first step, and FIG. 8B and FIG. 9B illustrate an inclination measurement state according to the second step. A rotation of the substrate type sensor unit 600 from the first angle to the second angle by 180 degrees may be performed through an aligner provided outside the super-critical treating chamber 500. For example, the substrate type sensor unit 600 may be rotated by the aligner for aligning the substrate included in the buffer unit 200. The rotated substrate type sensor unit 600 may be transferred by a transfer robot 320 and located at the support member 540.

According to a state in which the substrate type sensor unit 600 is provided at the first angle according to the first step, the first sensor 621 may be located above the first support pin 546a, and the second sensor 622 may be located above the fourth support pin 546d. According to a state in which the substrate type sensor unit 600 is provided at the second angle according to the second step, the first sensor 621 may be located above the fourth support pin 546d, and the second sensor 622 may be located above the first support pin 546a. The positions of the first sensor 621 and the second sensor 622 are only examples, and are not intended to be limited to the above-described positions. However, inventors understand that a horizontal state by the support member 540 can be most accurately derived when the sensors are located above the support pin 546. However, since a plurality of support pins 546 may be provided at positions different from those of an embodiment of the inventive concept according to a design, the position of the sensor according to the first angle may be appropriately modified in consideration of common sense.

Measured values of the first sensor 621 and the second sensor 622 may be changed according to a temperature. As described above, this is an essential feature of IMU. According to an embodiment of the inventive concept, the horizontal state may be measured despite a change in a measured value according to the temperature by measuring an inclination in a state provided at the first angle and an inclination in a state provided at the second angle.

For example, it is assumed that the first temperature (a temperature higher than room temperature), for example, is a temperature atmosphere around 70° C. It is assumed that an intrinsic error of (0.64°, 0.42°) occurs in the first sensor 621 at (Level X, Level Y) coordinates in a temperature atmosphere around 70° C. And it is assumed that the second sensor 622 generates an intrinsic error by (0.61°, 0.43°) at (Level X, Level Y) coordinates in the temperature atmosphere around 70° C.

When a value of the zero-calibrated IMU in the horizontal state is (0.00°, 0.00°), as illustrated in FIG. 8A and FIG. 8B when the support member is provided in a state that can horizontally support the wafer, a measured value V1 by the substrate type sensor unit 600 provided at the first angle according to the first step is (0.64°, 0.42°) at the first sensor 621 and (0.61°, 0.43°) at the second sensor 622. In addition, a measured value V2 measured by the substrate type sensor unit 600 provided at the second angle according to the second step is (0.64°, 0.42°) at the first sensor 621, and (0.61°, 0.43° at the second sensor 622. When the wafer is provided in a state capable of horizontally supporting the wafer, only an intrinsic error of each sensor is present, and as a result, V1–V2 is (0.00°, 0.00°), which is determined to be in the horizontal state. However, in an embodiment of this invention, it is expressed as a mathematical value (0.00°, 0.00°), but if it is a state that can be substantially regarded as (0.00°, 0.00°), it is determined as a horizontal state. For example, if the range of (±0.05°, ±0.05°) is can be evaluated as horizontal, it is determined in the horizontal state even if it is not mathematically (0.00°, 0.00°).

Compared with the table, it is shown in Table 1 below.

TABLE 1

|  | Intrinsic Error in a Temperature Atmosphere of the First Temperature | Measured value V1 at the First Angle | Measured Value V2 at the Second Angle | V1 − V2 | Evaluation |
| --- | --- | --- | --- | --- | --- |
| First Sensor 621 | (0.64°, 0.42°) | (0.64°, 0.42°) | (0.64°, 0.42°) | (0.00°, 0.00°) | Horizontal |
| Second Sensor 622 | (0.61°, 0.43°) | (0.61°, 0.43°) | (0.61°, 0.43°) | (0.00°, 0.00°) | Horizontal |

As shown in FIG. 9A and FIG. 9B, when the wafer is supported by the support member 540, a case where the wafer is inclined by θ will be described. It is assumed that the first sensor 621 has an intrinsic error (0.64°, 0.42°) at coordinates of (Level X, Level Y) in the first temperature atmosphere around 70° C. And it is assumed that the second sensor 622 has an intrinsic error (0.61°, 0.43°) at coordinates of (Level X, Level Y) in a temperature atmosphere around 70° C. It is assumed that the vector coordinates according to the inclination of the substrate type sensor unit 600 by θ in the state provided at the first angle are (0.07°, −0.05°.) The measured value V1 measured in a state in which the substrate type sensor unit 600 according to the first step is provided at a first angle: the first sensor 621 is (0.71°, 0.37°), and the second sensor 622 is (0.68°, 0.38°). The measured value V2 measured in a state in which the substrate type sensor unit 600 according to the second step is provided at the second angle: the first sensor 621 is (0.54°, 0.48°), and the second sensor 622 is (0.57°, 0.47°). Therefore, in the case of the first sensor 621, V1−V2 is not (0.00°, 0.00°), and thus it may be determined as non-horizontal state.

Compared with the table, it is shown in Table 2 below.

TABLE 2

The measured values in the state of FIG. 9A and FIG. 9B in the first temperature atmosphere.

|  | Intrinsic Error in a Temperature Atmosphere of the First Temperature | Measured Value V1 at the First Angle | Measured Value V2 at the Second Angle | V1 − V2 | Evaluation |
| --- | --- | --- | --- | --- | --- |
| First Sensor 621 | (0.64°, 0.42°) | (0.71°, 0.37°) | (0.57°, 0.47°) | (0.14°, −0.1°) | Inclined |
| Second Sensor 622 | (0.61°, 0.43°) | (0.68°, 0.38°) | (0.54°, 0.48°) | (0.14°, −0.1°) | Inclined |

A position of the first sensor 621 at the first angle of the first step becomes the position of the second sensor 622 at the second angle if the substrate type sensor unit 600 rotates 180° in the second step. Likewise, the position of the second sensor 622 at the first angle of the first step becomes the position of the first sensor 621 at the second angle if the substrate type sensor unit 600 is rotated 180° in the second step. In addition, the measured values of the first sensor 621 and the second sensor 622 at the second angle form a part of the measured value by measuring the inclination value θ as (−0.07, 0.05) as the direction of the sensor is reversed. That is, since V1=(Level X intrinsic error, Level Y intrinsic error)+(0.07°, −0.05°), and V2=(Level X intrinsic error, Level Y intrinsic error)+(−0.07°, +0.05°), an inclination value θ may be obtained from the formula of (V1−V2)/2. According to an embodiment, θ=(V1−V2)/2=(0.07°, −0.05°).

From another point of view, the inclination value can be measured based on the measured position.

TABLE 3

Calculate the inclination value according to a different viewpoint from the measured value in the state of FIG. 9A and FIG. 9B in the first temperature atmosphere.

|  | First Position (Above the First Support Pin 546a) | | Second Position (Above the Fourth Support Pin 546d) | |
| --- | --- | --- | --- | --- |
|  | Level X | Level Y | Level X | Level Y |
| First Angle | ⓐ$_{1X}$ = 0.71° (First Sensor) | ⓐ$_{1Y}$ = 0.37° (First Sensor) | ⓑ$_{1X}$ = 0.68° (Second Sensor) | ⓑ$_{1Y}$ = 0.38° (Second Sensor) |
| Second Angle | ⓑ$_{2X}$ = 0.54° (Second Sensor) | ⓑ$_{2Y}$ = 0.48° (Second Sensor) | ⓐ$_{2X}$ = 0.57° (First Sensor) | ⓐ$_{2Y}$ = 0.47° (First Sensor) |
| Inclination Value | {(ⓐ$_{1X}$ − ⓐ$_{2X}$) + (ⓑ$_{1X}$ − ⓑ$_{2X}$)}/ 4 = 0.07° | {(ⓐ$_{1Y}$ − ⓐ$_{2Y}$) + (ⓑ$_{1Y}$ − ⓑ$_{2Y}$)}/ 4 = −0.05° | {(ⓑ$_{1X}$ − ⓑ$_{2X}$) + (ⓐ$_{1X}$ − ⓐ$_{2X}$)}/ 4 = 0.07° | {(ⓑ$_{1Y}$ − ⓑ$_{2Y}$) + (ⓐ$_{1Y}$ − ⓐ$_{2Y}$)}/ 4 = −0.05° |

Figure 10:
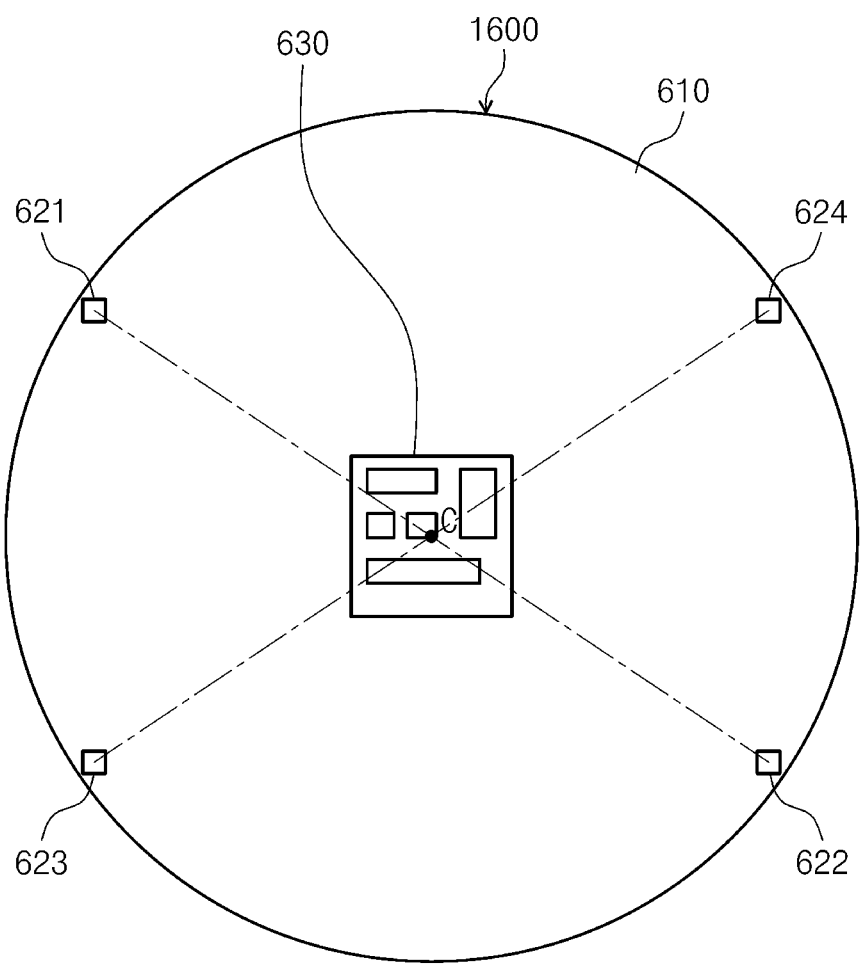
FIG. 10 is a top plan view of a substrate type sensor unit according to another embodiment of the inventive concept.
Figure 11:
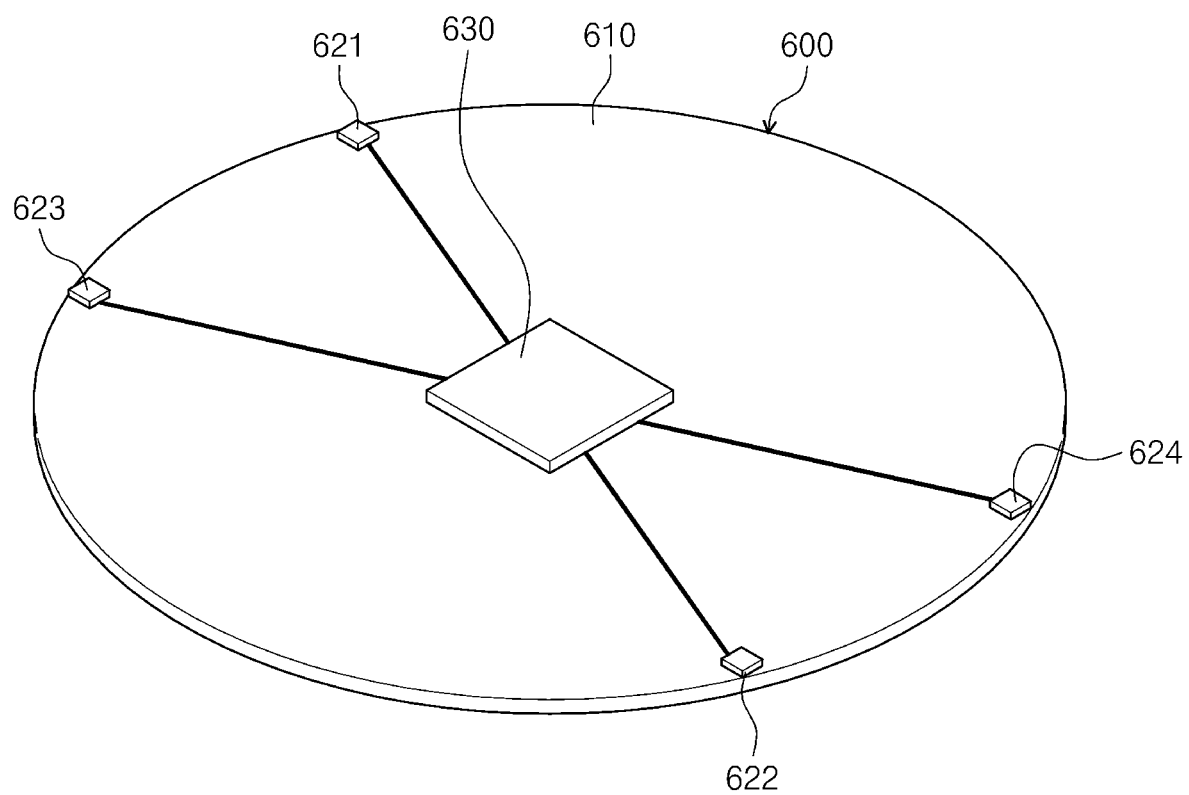
FIG. 11 is a perspective view of a substrate type sensor unit according to an embodiment of FIG. 10.

According to another aspect of the inventive concept, the inclination value may be calculated through {(ⓐ1−ⓐ2)+(ⓑ1−ⓑ2)}/4. The sensor of the substrate type sensor unit 600 described in FIG. 5 to FIG. 9B may obtain the same result only with the first sensor 621, but may be validated by providing the second sensor 622. In addition, an inclination value of higher accuracy may be calculated through the average of the inclination values derived using the first sensor 621 and the second sensor 622. FIG. 10 is a plan view of a substrate type sensor unit 1600 according to another embodiment of the inventive concept. FIG. 11 is a perspective view of a substrate type sensor unit 1600 according to an embodiment of FIG. 10. A substrate type sensor unit 1600 according to another embodiment will be described with reference to FIG. 10 and FIG. 11. When the substrate type sensor unit 1600 is used, it may be measured whether the wafer W may be horizontally supported by the support member 540. For example, the substrate type sensor unit 1600 may measure the uppermost height difference between the support pins 546 in a resolution of 0.1 deg or less, and may check whether the uppermost heights of the support pins 546 are the same during the process.

The substrate type sensor 1600 includes one or more sensors. The sensor may be IMU. The sensor provided to the substrate type sensor unit 600 includes a first sensor 621 and a second sensor 622. Furthermore, a third sensor 623 and a fourth sensor 624 may be further included. The first sensor 621, the second sensor 622, the third sensor 623, and the fourth sensor 624 are IMUs.

The first sensor 621 and the second sensor 622 may be located at positions opposite to each other with respect to the center C of the substrate type sensor unit 600. The first sensor 621 and the second sensor 622 may be located at opposite edges of the substrate type sensor unit 600. In an embodiment, the first sensor 621 and the second sensor 622 may be disposed to be located above the support pin 546, respectively. In more detail, the first sensor 621 may be located above the first support pin 546a, and the second sensor 622 may be located above the fourth support pin 546d. An angle formed by the first sensor 621 and the second sensor 622 based on the center C of the substrate type sensor unit 600 may be 180 degrees deg.

The third sensor 623 and the fourth sensor 624 may be located at positions opposite to each other with respect to the center C of the substrate type sensor unit 600. The third sensor 623 and the fourth sensor 624 may be located at opposite edges of the substrate type sensor unit 600. In an embodiment, the third sensor 623 and the fourth sensor 624 may be disposed to be located above the support pin 546, respectively. In more detail, the third sensor 623 may be located above the second support pin 546b, and the fourth sensor 624 may be located above the third support pin 546c. An angle formed by the third sensor 623 and the fourth sensor 624 based on the center C of the substrate type sensor unit 600 may be 180 degrees deg.

The substrate type sensor unit 1600 includes a central module 630. The central module 630 is a first sensor 621. It may include a communication unit that receives data from the second sensor 622, the third sensor 623, and/or the fourth sensor 624, a storage unit that stores data, a transmission unit that transmits data, and a power unit that provides power to each component. The first sensor 621 and the central module 630 may be connected to the central module 630 to receive data acquired by the first sensor 621. The second sensor 622 and the central module 630 may be connected to the central module 630 to receive data acquired by the second sensor 622. The third sensor 623 and the central module 630 may be connected to the central module 630 to receive data acquired by the third sensor 623. The fourth sensor 624 and the central module 630 may be connected to the central module 630 to receive data acquired by the fourth sensor 624. The transmission unit may be provided as a wireless communication module. An operation to be described later may be performed in an external device through data transmitted from the transmitter. Alternatively, an operation unit is provided to the central module 630, and an operation to be described later may be performed in the operation unit to transmit an inclination generated by the support member 540 to an external device through the transmission unit.

Figure 12A:
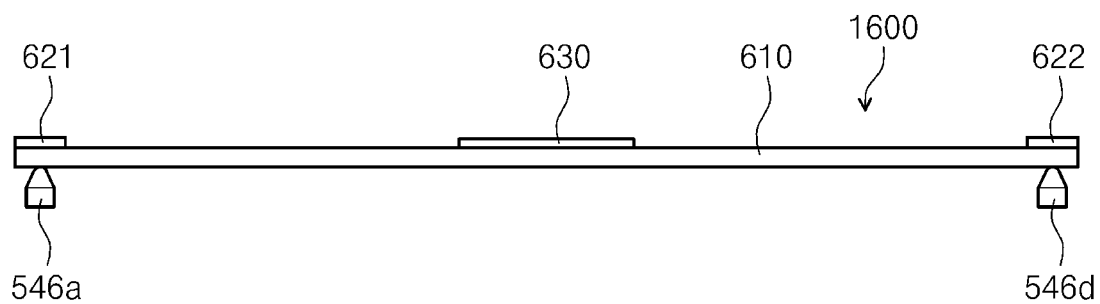
FIG. 12A and FIG. 12B describe a method of measuring whether the support member may horizontally support the wafer using a substrate type sensor unit according to an embodiment of FIG. 10, and will be described when the support member is provided in a state in which the support member may horizontally support the wafer.
Figure 12B:
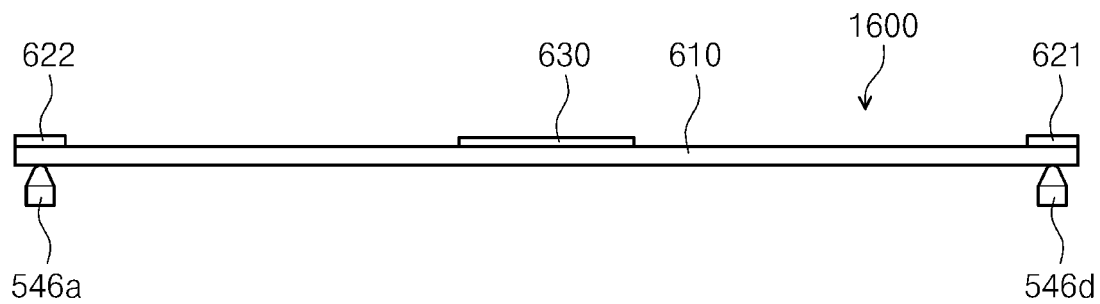
Figure 13A:
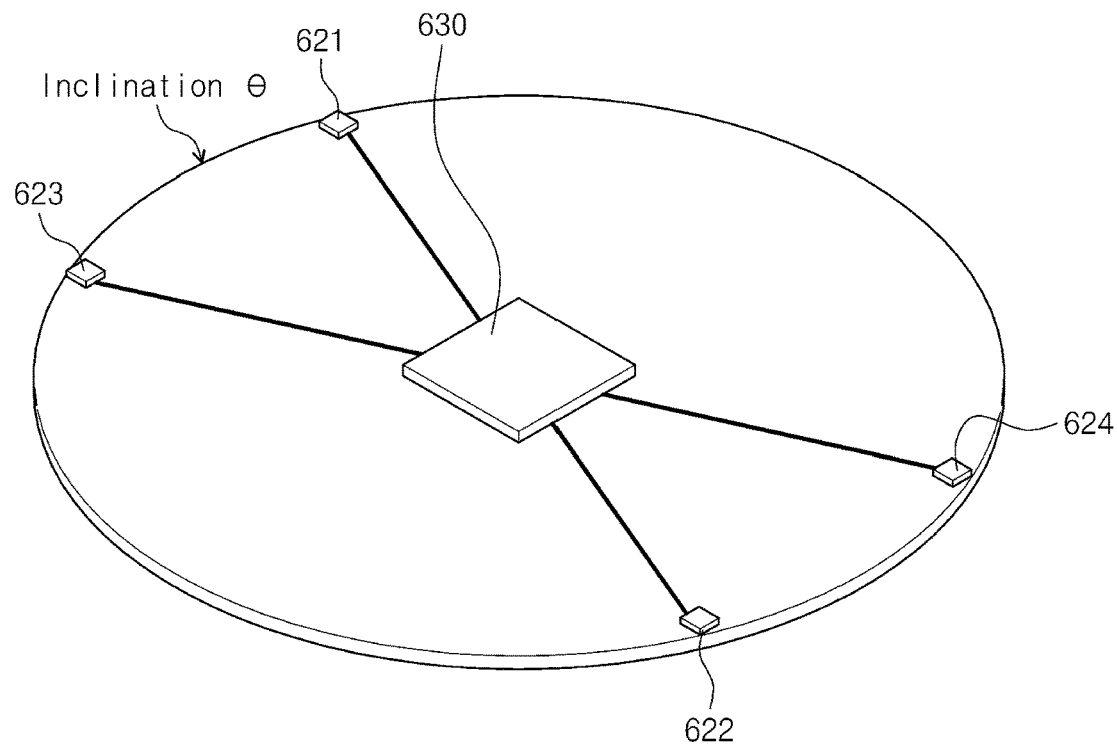
FIG. 13A and FIG. 13B illustrate a method of measuring whether the support member may horizontally support the wafer using a substrate type sensor unit according to an embodiment of FIG. 10, and as an example, in a state in which the support member cannot horizontally support the wafer when inclined by degree of θ.
Figure 13B:
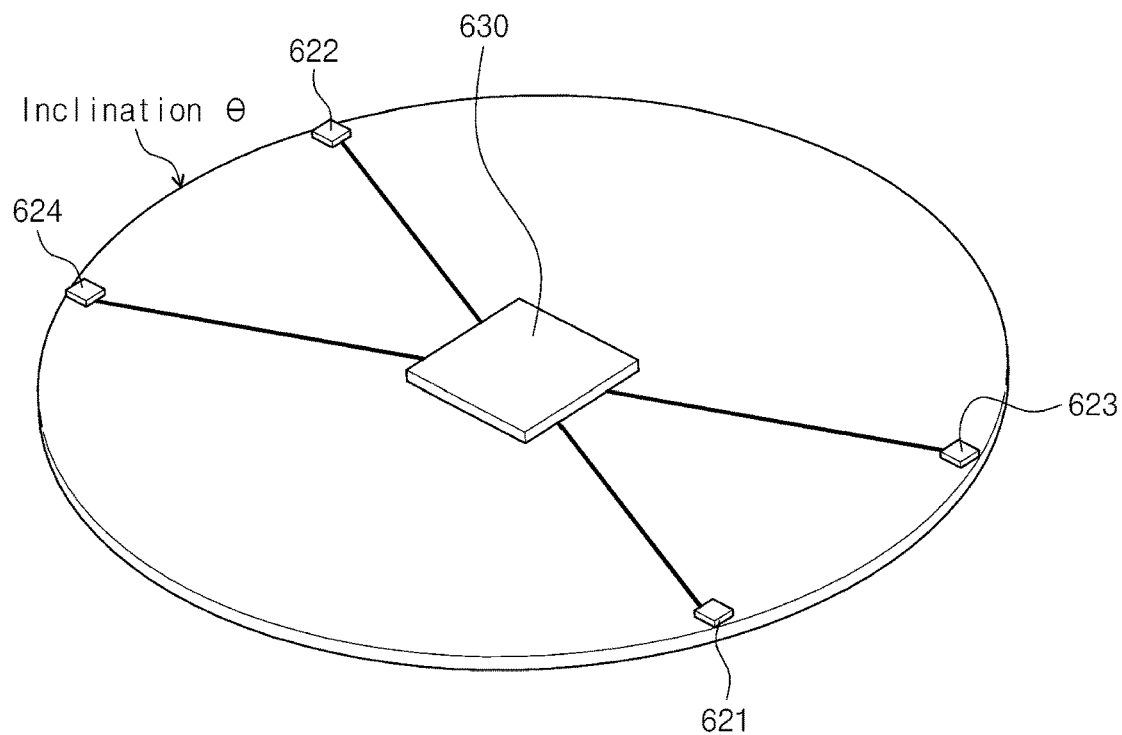

FIG. 12A and FIG. 12B describe a method of measuring whether the support member may horizontally support the wafer using the substrate type sensor unit 1600 according to an embodiment of FIG. 10, and will be described when the support member is provided in a state capable of horizontally supporting the wafer. FIG. 13A and FIG. 13B illustrate a method of measuring whether a support member may horizontally support the wafer using the substrate type sensor unit 1600 according to an embodiment of FIG. 10, as an example of a state in which the support member cannot horizontally support the wafer, when the wafer is supported, it will be inclined by θ. A horizontal measurement method of the support member 540 using the substrate type sensor unit 1600 will be described with reference to FIG. 12A, FIG. 12B, FIG. 13A and FIG. 13B.

According to an embodiment, the substrate type sensor unit 1600 includes a first step of measuring the inclination of the support member 540 while provided at a first angle, and a second step of measuring the inclination of the support member 540 while provided at a second angle. The second angle is rotated 180 degrees (deg) from the first angle. FIG. 12A and FIG. 13A illustrate an inclination measurement state according to the first step, and FIG. 12B and FIG. 13B illustrate an inclination measurement state according to the second step. A rotation of the substrate type sensor unit 1600 from the first angle to the second angle may be performed through an aligner provided outside the supercritical treating chamber 500. For example, the substrate type sensor unit 1600 may be rotated by an aligner for aligning substrates in the buffer unit 200. The rotated substrate type sensor unit 1600 may be transferred by the transfer robot 320 and located on the support member 540.

According to a state in which the substrate type sensor unit 1600 is provided at the first angle according to the first step, the first sensor 621 may be located above the first support pin 546a, and the second sensor 622 may be located above the fourth support pin 546d. In addition, the third sensor 623 may be located above the second support pin 546b, and the fourth sensor 624 may be located above the third support pin 546c.

According to a state in which the substrate type sensor unit 600 is provided at the second angle according to the second step, the first sensor 621 may be located above the fourth support pin 546d, and the second sensor 622 may be located above the first support pin 546a. In addition, the third sensor 623 may be located above the third support pin 546c, and the fourth sensor 624 may be located above the second support pin 546b.

The positions of the first sensor 621, the second sensor 622, the third sensor 623, and the fourth sensor 624 are merely examples, and are not intended to be limited to the above-described positions. However, the inventors understand that the horizontal state by the support member 540 can be most accurately derived when the sensors are located above the support pin 546. However, since a plurality of support pins 546 may be provided at positions different from those of an embodiment of the inventive concept according to a design, the position of the sensor according to the first angle may be appropriately modified in consideration of common sense.

The measured values of the first sensor 621, the second sensor 622, the third sensor 623, and the fourth sensor 624 may vary according to temperature. As described above, this is an essential feature of IMU. According to an embodiment of the inventive concept, a horizontal state may be measured despite a change in a measured value according to temperature by measuring an inclination in a state provided at the first angle and an inclination in a state provided at the second angle.

For example, it is assumed that the first temperature (a temperature higher than room temperature), for example, is a temperature atmosphere around 70° C. It is assumed that an intrinsic error of (0.64°, 0.42°) occurs in the first sensor 621 at (Level X, Level Y) coordinates in a temperature atmosphere around 70° C. And it is assumed that the second sensor 622 has an intrinsic error by (0.61°, 0.43°) at (Level X, Level Y) coordinates in a temperature atmosphere around 70° C.

It is assumed that the third sensor 623 has an intrinsic error by (0.62°, 0.43°) coordinates in a temperature atmosphere around 70° C. In addition, it is assumed that the fourth sensor 624 generates an intrinsic error by (0.65°, 0.42°) coordinates in a temperature atmosphere around 70° C.

When the value of IMU in the horizontal state is (0.00°, 0.00°), as illustrated in FIG. 12A and FIG. 12B, when the support member is provided in a state that can horizontally support the wafer, the measured value V1 measured by the substrate type sensor unit 600 in accordance with the first step provided at the first angle at the first sensor 621 is (0.64°, 0.42°), the second sensor 622 is (0.61°, 0.43°), the third sensor 623 is (0.62°, 0.43°), and the fourth sensor 624 is (0.65°, 0.42°). Also, the measured value V2 measured in a state in which the substrate type sensor unit 600 according to the second step is provided at a second angle at the first sensor 621 is (0.64°, 0.42°), the second sensor 622 is (0.61°, 0.43°), the third sensor 623 is (0.62°, 0.43°), and the fourth sensor 624 is (0.65°, 0.42°). When the wafer is provided in a state capable of horizontally supporting the wafer, only the intrinsic error of each sensor is present, and as a result, all V1−V2 is derived as (0.00°, 0.00°), which is determined to be in the horizontal state. However, in the embodiment of this invention, it is expressed as a mathematical value (0.00°, 0.00°), but if it is a state that can be substantially regarded as (0.00°, 0.00°), it is determined as a horizontal state. For example, if the range of (±0.05°, ±0.05°) is evaluated as viewed horizontally, it is determined in the horizontal state even if it is not mathematically (0.00°, 0.00°).

Compared with the table, it is shown in Table 4 below.

TABLE 4

The measured values in the state of FIG. 12A and FIG. 12B in the first temperature atmosphere.

| | Intrinsic Error in a Temperature Atmosphere of the First Temperature | Measured value V1 at the First Angle | Measured Value V2 at the Second Angle | V1 − V2 | Evaluation |
| --- | --- | --- | --- | --- | --- |
| First Sensor 621 | (0.64°, 0.42°) | (0.64°, 0.42°) | (0.64°, 0.42°) | (0.00°, 0.00°) | Horizontal |
| Second Sensor 622 | (0.61°, 0.43°) | (0.61°, 0.43°) | (0.61°, 0.43°) | (0.00°, 0.00°) | Horizontal |

TABLE 4-continued

The measured values in the state of FIG. 12A and FIG. 12B in the first temperature atmosphere.

| | Intrinsic Error in a Temperature Atmosphere of the First Temperature | Measured value V1 at the First Angle | Measured Value V2 at the Second Angle | V1 − V2 | Evaluation |
|---|---|---|---|---|---|
| Third Sensor 623 | (0.62°, 0.43°) | (0.62°, 0.43°) | (0.62°, 0.43°) | (0.00°, 0.00°) | Horizontal |
| Fourth Sensor 624 | (0.65°, 0.42°) | (0.65°, 0.42°) | (0.65°, 0.42°) | (0.00°, 0.00°) | Horizontal |

As shown in FIG. 13A and FIG. 13B, when the wafer is supported by the support member 540, a case where the wafer is inclined by θ will be described. It is assumed that the first sensor 621 has an intrinsic error (0.64°, 0.42°) at coordinates of (Level X, Level Y) in the first temperature atmosphere around 70° C. It is assumed that the second sensor 622 has an intrinsic error by (0.61°, 0.43°) at coordinates of (Level X, Level Y) in the temperature atmosphere around 70° C. It is assumed that the third sensor 623 has an intrinsic error by (0.62°, 0.43°) at coordinates of (Level X, Level Y) at a temperature around 70° C. In addition, it is assumed that the fourth sensor 624 has an intrinsic error by (0.65°, 0.42°) at coordinates of (Level X, Level Y) in a temperature atmosphere around 70° C. It is assumed that the vector coordinates according to the inclination by θ in the state in which the substrate type sensor unit 1600 is provided at the first angle are (0.07°, −0.05°). In a state in which the substrate type sensor unit 600 according to the first step is provided at the first angle, the measured value V1 of the first sensor 621 is (0.71°, 0.37°), the second sensor 622 is (0.68°, 0.38°), the third sensor 623 is (0.69°, 0.38°), and the fourth sensor 624 is (0.72°, 0.37°). In addition, the measured value V2 measured while the substrate type sensor unit 600 according to the second step is provided at the second angle such that the first sensor 621 is (0.57°, 0.47°), and the second sensor 622 is (0.54°, 0.48°), the third sensor 623 is (0.55°, 0.48°), and the fourth sensor 624 is (0.58°, 0.47°). When provided in a state capable of horizontally supporting the wafer, there is a substantially measured value, and in addition, an intrinsic error between each sensor is added as a vector sum. Accordingly, it may be determined that the V1−V2 of the first sensor 621, the second sensor 622, the third sensor 623, and/or the fourth sensor 624 is not in a horizontal state (0.00°, 0.00°).

Compared with the table, it is shown in Table 5 below.

TABLE 5

Measured values in the state of FIG. 13A and FIG. 13B in the first temperature atmosphere.

| | Intrinsic Error in a Temperature Atmosphere of the First Temperature | Measured Value V1 at the First Sensor | Measured Value V2 at the Second Sensor | V1 − V2 | Evaluation |
|---|---|---|---|---|---|
| First Sensor 621 | (0.64°, 0.42°) | (0.71°, 0.37°) | (0.57°, 0.47°) | (0.14, −0.1) | Inclined |
| Second Sensor 622 | (0.61°, 0.43°) | (0.68°, 0.38°) | (0.54°, 0.48°) | (0.14, −0.1) | Inclined |
| Third Sensor 623 | (0.62°, 0.43°) | (0.69°, 0.38°) | (0.55°, 0.48°) | (0.14, −0.1) | Inclined |
| Fourth Sensor 624 | (0.65°, 0.42°) | (0.72°, 0.37°) | (0.58°, 0.47°) | (0.14, −0.1) | Inclined |

The position of the first sensor 621 at the first angle of the first step becomes the position of the second sensor 622 at the second angle at which the substrate type sensor unit 600 is rotated 180° in the second step. In addition, the position of the second sensor 622 at the first angle of the first step becomes the position of the first sensor 621 at the second angle at which the substrate type sensor unit 600 is rotated 180° in the second step. And the position of the third sensor 623 at the first angle of the first step becomes the position of the fourth sensor 624 at the second angle at which the substrate type sensor unit 600 is rotated 180° in the second step. And the position of the fourth sensor 624 at the first angle of the first step becomes the position of the third sensor 623 at the second angle at which the substrate type sensor unit 600 is rotated 180° in the second step. In addition, the measured values of the first sensor 621 and the second sensor 622 at the second angle form a part of the measured value by measuring the inclination value $\theta$ as (−0.07, 0.05) as the direction of the sensor is reversed. That is, since V1=(Level X intrinsic error, Level Y intrinsic error)+(0.07°, −0.05°), and V2=(Level X intrinsic error, Level Y intrinsic error)+(−0.07°, +0.05°), an inclination value $\theta$ may be obtained from the formula of (V1−V2)/2. According to an embodiment, $\theta$=(V1−V2)/2=(0.07°, −0.05°). From another point of view, the inclination value can be measured based on the measured position.

value according to another embodiment of the inventive concept will be described with reference to FIG. 8 to FIG. 12B.

FIG. 8 describes a method of measuring whether the support member 540 may horizontally support the wafer using the substrate type sensor unit 600 according to an embodiment of the inventive concept, and will be described when the support member is provided in a state capable of horizontally supporting the wafer. FIG. 9A and FIG. 9B illustrate a method of measuring whether a support member may horizontally support the wafer using the substrate type sensor unit 600 according to an embodiment of the inventive concept, and as an example, a state in which the support member cannot horizontally support the wafer will be inclined by $\theta$. A horizontal measurement method of a support member using a substrate type sensor unit 600 will be described with reference to FIG. 8A, FIG. 8B, FIG. 9A and FIG. 9B.

According to an embodiment, the substrate type sensor unit 600 includes a first step of measuring an inclination of the support member 540 while provided at the first angle, and a second step of measuring the inclination of the support member 540 while provided at the second angle. The second angle is rotated 180 degrees (deg) from the first angle. FIG. 8A and FIG. 9A illustrate an inclination measurement state

TABLE 6

Calculation of the inclination value according to a different viewpoint from the measured value in the state of FIG. 9A and FIG. 9B in the first temperature atmosphere.

|  | First Position (Above the First Support Pin 546a) | | Second Position (Above the Fourth Support Pin 546d) | |
| --- | --- | --- | --- | --- |
|  | Level X | Level Y | Level X | Level Y |
| First Angle | ⓐ$_{1X}$ = 0.71° (First Sensor) | ⓐ$_{1Y}$ = 0.37° (First Sensor) | ⓑ$_{1X}$ = 0.68° (Second Sensor) | ⓑ$_{1Y}$ = 0.38° (Second Sensor) |
| Second Angle | ⓑ$_{2X}$ = 0.54° (Second Sensor) | ⓑ$_{2Y}$ = 0.48° (Second Sensor) | ⓐ$_{2X}$ = 0.57° (First Sensor) | ⓐ$_{2Y}$ = 0.47° (First Sensor) |
| Inclination Value | {(ⓐ$_{1X}$ − ⓐ$_{2X}$) + (ⓑ$_{1X}$ − ⓑ$_{2X}$)}/4 = 0.07° | {(ⓐ$_{1Y}$ − ⓐ$_{2Y}$) + (ⓑ$_{1Y}$ − ⓑ$_{2Y}$)}/4 = −0.05° | {(ⓑ$_{1X}$ − ⓑ$_{2X}$) + (ⓐ$_{1X}$ − ⓐ$_{2X}$)}/4 = 0.07° | {(ⓑ$_{1Y}$ − ⓑ$_{2Y}$) + (ⓐ$_{1Y}$ − ⓐ$_{2Y}$)}/4 = −0.05° |
|  | Third Position (Above the Second Support Pin 546b) | | Fourth (Above the Third Support Pin 546c) | |
|  | Level X | Level Y | Level X | Level Y |
| First Angle | ⓒ$_{1X}$ = 0.69° (Third Sensor) | ⓒ$_{1Y}$ = 0.38° (Third Sensor) | ⓒ$_{1X}$ = 0.72° (Fourth Sensor) | ⓒ$_{1Y}$ = 0.37° (Fourth Sensor) |
| Second Angle | ⓓ$_{2X}$ = 0.55° (Fourth Sensor) | ⓓ$_{2Y}$ = 0.48° (Fourth Sensor) | ⓓ$_{2Y}$ = 0.58° (Third Sensor) | ⓓ$_{2Y}$ = 0.47° (Third Sensor) |
| Inclination Value | {(ⓒ$_{1X}$ − ⓒ$_{2X}$) + (ⓓ$_{1X}$ − ⓓ$_{2X}$)}/4 = 0.07° | {(ⓒ$_{1Y}$ − ⓒ$_{2Y}$) + (ⓓ$_{1Y}$ − ⓓ$_{2Y}$)}/4 = −0.05° | {(ⓓ$_{1X}$ − ⓓ$_{2X}$) + (ⓒ$_{1X}$ − ⓒ$_{2X}$)}/4 = 0.07° | {(ⓓ$_{1Y}$ − ⓓ$_{2Y}$) + (ⓒ$_{1Y}$ − ⓒ$_{2Y}$)}/4 = −0.05° |

According to another aspect of the inventive concept, the inclination values are {(ⓐ1−ⓐ2)+(ⓑ1−ⓑ2)}/4 and {(ⓒ1X−ⓒ2X)+(ⓓ1X−ⓓ2X)}/4. In addition, an inclination value of higher accuracy may be calculated through an average of the inclination values derived using the first sensor 621, the second sensor 622, the third sensor 623, and the fourth sensor 624. Hereinafter, a method of calculating an inclination value according to another embodiment will be described. According to another embodiment, the sensor provided to the substrate type sensor unit 600 is a 3-axis acceleration sensor. A method of calculating an inclination according to a first step, and FIG. 8B and FIG. 9B illustrate an inclination measurement state according to a second step. The rotation of the substrate type sensor unit 600 from the first angle to the second angle may be performed through an aligner provided outside the supercritical treating chamber 500. For example, the substrate type sensor unit 600 may be rotated using an aligner provided to the buffer unit 200 to align the substrates. The rotated substrate type sensor unit 600 may be transferred by the transfer robot 320 and located on the support member 540.

According to a state in which the substrate type sensor unit 600 is provided at a first angle according to the first step, the first sensor 621 may be located above the first support pin 546*a*, and the second sensor 622 may be located above the fourth support pin 546*d*. According to a state in which the substrate type sensor unit 600 is provided at a second angle according to the second step, the first sensor 621 may be located above the fourth support pin 546*d*, and the second sensor 622 may be located above the first support pin 546*a*. The positions of the first sensor 621 and the second sensor 622 are only examples, and are not intended to be limited to the above-described positions. However, the inventors understand that the horizontal state by the support member 540 can be most accurately derived when the sensors are located above the support pin 546. However, since a plurality of support pins 546 may be provided at positions different from those of an embodiment of the inventive concept according to a design, the position of the sensor according to the first angle may be appropriately modified in consideration of common sense.

The measured values of the first sensor 621 and the second sensor 622 may be changed according to a temperature. As described above, this is an essential feature of the acceleration sensor. According to an embodiment of the inventive concept, a horizontal state may be measured despite a change in a measured value according to the temperature by measuring an inclination in a state provided at the first angle and an inclination in a state provided at the second angle.

For example, it is assumed that the first temperature (a temperature higher than room temperature), for example, is a temperature atmosphere around 70° C. It is assumed that the first sensor 621 has an intrinsic error of (1, 1, −1) in the vector coordinates of (X, Y, Z) in a temperature atmosphere around 70° C. In addition, it is assumed that the second sensor 622 generates an intrinsic error by (0.8, 0.7, −1.1) in a temperature atmosphere around 70° C. to vector coordinates (X, Y, Z).

When the value of the acceleration sensor in the horizontal state is (0, 0, −9.8), as illustrated in FIG. 8A and FIG. 8B, when the support member is provided in a state that can horizontally support the wafer, the measured value V1 by the substrate type sensor unit 600 provided at the first angle according to the first step is (1, 1, 10.8) at the first sensor 621, and (0.8, 0.7, −10.9) at the second sensor 622. The measured value V2 by the substrate type sensor unit 600 at the second angle according to the second step is (1, 1, −10.8) at the first sensor 621, and (0.8, 0.7, −10.9) at the second sensor 622. When provided in the state capable of supporting the wafer horizontally, only the measured value corresponds to the Z value and the intrinsic error of each sensor exist, and as a result, all V1−V2 is derived as (0, 0, 0), which is determined to be in the horizontal state. However, in the embodiment of this invention, it is expressed as a mathematical value of (0, 0, 0), but if it can be substantially viewed as (0, 0, 0), it is determined as a horizontal state. For example, if the ranges of (±0.05, ±0.05, ±0.05) are evaluated as viewed horizontally, it is determined in a horizontal state even if it is not mathematically (0, 0, 0).

Compared with the table, it is shown in Table 7 below.

TABLE 7

The measured values in the state of FIG. 8A and FIG. 8B in the first temperature atmosphere.

| | Intrinsic Error in a Temperature Atmosphere of the First Temperature | Measured value V1 at the First Angle | Measured Value V2 at the Second Angle | V1 − V2 | Evaluation |
|---|---|---|---|---|---|
| First Sensor 621 | (1, 1, −1) | (1, 1, −10.8) | (1, 1, −10.8) | (0, 0, 0) | Horizontal |
| Second Sensor 622 | (0.8, 0.7, −1.1) | (0.8, 0.7, −10.9) | (0.8, 0.7, −10.9) | (0, 0, 0) | Horizontal |

As shown in FIG. 9A and FIG. 9B, when the wafer is supported by the support member 540, a case where the wafer is inclined by θ will be described. It is assumed that the first sensor 621 has an intrinsic error of (1, 1, −1) in the vector coordinates of (X, Y, Z) in the first temperature atmosphere around 70° C. In addition, it is assumed that the second sensor 622 generates an intrinsic error by (0.8, 0.7, −1.1) in a temperature atmosphere around 70° C. to vector coordinates (X, Y, Z). It is assumed that vector coordinates according to the inclination of the substrate type sensor unit 600 by θ in the state provided at the first angle are (2, 0.5, and −9.56). The measured value V1 measured in a state in which the substrate type sensor unit 600 according to the first step is provided at a first angle, wherein the first sensors 621 are (3, 1.5, −10.3), and the second sensors 622 are (2.8, 1.2, and −10.4). In addition, the measured value V2 measured in a state in which the substrate type sensor unit 600 according to the second step is provided at a second angle of a first sensor is (−1, 0.5, −10.3), and the second sensor 621 is (−1, 0.2, and −10.4). When provided in a state capable of horizontally supporting the wafer, there is a substantially measured value, and in addition, an intrinsic error between each sensor is added as a vector sum. Accordingly, in the case of the first sensor 621, V1−V2 is (2.8, 1.2, 0), and in the case of the second sensor 622, V1−V2 is derived as (2.8, 1, 0), and thus it may be determined that this is not a horizontal state.

Compared with the table, it is shown in Table 8 below.

TABLE 8

The measured values in the state of FIG. 9A and FIG. 9B in the first temperature atmosphere.

| | Intrinsic Error in a Temperature Atmosphere of the First Temperature | Measured value V1 at the First Angle | Measured Value V2 at the Second Angle | V1 − V2 | Evaluation |
|---|---|---|---|---|---|
| First Sensor 621 | (1, 1, −1) | (3, 1.5, −10.3) | (−1, 0.5, −10.3) | (4, 1, 0) | Inclined |
| Second Sensor 622 | (0.8, 0.7, −1.1) | (2.8, 1.2, −10.4) | (−1.2, 0.2, −10.4) | (4, 1, 0) | Inclined |

Through (V1−V2)/2, the X value and Y value of the vector coordinates according to the inclination by θ in the state provided at the first angle may be known. (V1−V2)/2=(x, y, 0). As a result, when it is determined that the support member is not in a horizontal state, the inclined direction may be determined through an equation. In the embodiment, (V1−V2)/2=(x, y, 0)=(2, 0.5, 0). Considering that the g value of the acceleration used by the acceleration sensor is the Earth's gravitational acceleration, if calculated using a polar coordinate system, the z value of the inclination θ with respect to the plane is known as the x value and y value, and thus can be obtained as a value of g*sin(a). Alternatively, Pythagorean's theorem can be used to obtain through $$|z| = \sqrt{g^2 - \left(\sqrt{x^2 + y^2}\right)}.$$

Considering the direction of gravity, the value of z is calculated as −|z|. As a result, vector coordinates according to the inclination of the substrate type sensor unit 600 by θ in a state provided at the first angle may be obtained using an acceleration sensor by $$\left(\frac{V1(x) - V2(x)}{2}, \frac{V1(y) - V2(y)}{2}, -\sqrt{g^2 - \left(\sqrt{x^2 + y^2}\right)}\right).$$

In addition, (V1+V2)/2 may derive (an intrinsic error of the X value, an intrinsic error of the Y value, and a Z value of V1 (or V2). For example, in an example, in the case of the first sensor 621, (V1+V2)/2=(1, 1, −10.3), and in the case of the second sensor 622, (V1+V2)/2=(0.8, 0.7, −10.4), In addition, the intrinsic error of the Z value may be calculated through a difference between V1(Z) or V2(Z) and a z value of an inclined value, which is $$z = -\sqrt{g^2 - \left(\sqrt{x^2 + y^2}\right)}.$$

The sensor of the substrate type sensor unit 600 described in FIG. 5 to FIG. 9 may obtain the same result only with the first sensor 621, but may be validated by providing the second sensor 622.

Subsequently, a method according to another embodiment of measuring an inclination value by the substrate type sensor unit 1600 according to another embodiment of the inventive concept referenced with reference to FIG. 10 will be described with reference to FIG. 12A, FIG. 12B, FIG. 13A and FIG. 13B. The substrate type sensor 1600 includes one or more sensors. The sensor is provided as a 3-axis or more acceleration sensor.

According to an embodiment, the substrate type sensor unit 1600 includes a first step of measuring the inclination of the support member 540 while provided at the first angle, and a second step of measuring the inclination of the support member 540 while provided at the second angle. The second angle is rotated 180 degrees (deg) from the first angle. FIG. 12A and FIG. 13A illustrate an inclination measurement state according to the first step, and FIG. 12B and FIG. 13B illustrate an inclination measurement state according to the second step. The rotation of the substrate type sensor unit 1600 from the first angle to the second angle may be performed through an aligner provided outside the supercritical treating chamber 500. For example, the substrate type sensor unit 1600 may be rotated using an aligner which is provided to the buffer unit 200 to align the substrate. The rotated substrate type sensor unit 1600 may be transferred by the transfer robot 320 and located on the support member 540.

According to a state in which the substrate type sensor unit 1600 is provided at a first angle according to the first step, the first sensor 621 may be located above the first support pin 546a, and the second sensor 622 may be located above the fourth support pin 546*d*. In addition, the third sensor 623 may be located above the second support pin 546*b*, and the fourth sensor 624 may be located above the third support pin 546*c*.

According to a state in which the substrate type sensor unit 600 is provided at the second angle according to the second step, the first sensor 621 may be located above the fourth support pin 546*d*, and the second sensor 622 may be located above the first support pin 546*a*. In addition, the third sensor 623 may be located above the third support pin 546*c*, and the fourth sensor 624 may be located above the second support pin 546*b*.

The positions of the first sensor 621, the second sensor 622, the third sensor 623, and the fourth sensor 624 are only examples, and are not intended to be limited to the above-described positions. However, the inventors understand that the horizontal state by the support member 540 can be most accurately derived when the sensors are located above the support pin 546. However, since a plurality of support pins 546 may be provided at positions different from those of an embodiment of the inventive concept according to a design, the position of the sensor according to the first angle may be appropriately modified in consideration of common sense.

The measured values of the first sensor 621, the second sensor 622, the third sensor 623, and the fourth sensor 624 may vary according to a temperature. As described above, this is an essential feature of the acceleration sensor. According to an embodiment of the inventive concept, a horizontal state may be measured despite a change in a measured value according to the temperature by measuring the inclination in a state provided at the first angle and the inclination in a state provided at the second angle.

For example, it is assumed that the first temperature (a temperature higher than room temperature), for example, is a temperature atmosphere around 70° C. It is assumed that the first sensor 621 has an intrinsic error of (1, 1, −1) in the vector coordinates of (X, Y, Z) in a temperature atmosphere around 70° C. It is assumed that the second sensor 622 has an intrinsic error by (0.8, 0.7, −1.1) in the vector coordinates of (X, Y, Z) in a temperature atmosphere around 70° C. It is assumed that the third sensor 623 has an intrinsic error by (0.6, 0.7, −1) in the vector coordinates of (X, Y, Z) in a temperature atmosphere around 70° C. In addition, it is assumed that the fourth sensor 624 has an intrinsic error by (0.5, 0.8, −1.2) in a temperature atmosphere around 70° C. to vector coordinates (X, Y, Z).

When the value of the acceleration sensor in the horizontal state is (0, 0, −9.8), as illustrated in FIG. 12A and FIG. 12B, the measured value V1 measured with the substrate type sensor unit 600 provided at the first angle by the first sensor 621 is (1, −10.8) the second sensor 622 is (0.8, 0.7, −10.9), the third sensor 623 is (0.6, 0.7, −10.8), and the fourth sensor 624 is (0.5, 0.8, −11). In addition, the measured value V2 measured in a state in which the substrate type sensor unit 600 according to the second step is provided at a second angle by the first sensor is (1, 1, −10.8), the second sensor 622 is (0.8, 0.7, −10.9), the third sensor 623 is (0.6, 0.7, −10.8), and the fourth sensor 624 is (0.5, 0.8, −11). When provided in a state capable of supporting the wafer horizontally, only the measured value corresponds to the Z value and the intrinsic error of each sensor exist, and as a result, all V1−V2 is derived as (0, 0, 0), which is determined to be in the horizontal state. However, in the embodiment of this invention, it is expressed as a mathematical value of (0, 0, 0), but if it can be substantially viewed as (0, 0, 0), it is determined as a horizontal state. For example, if the ranges of (±0.05, ±0.05, ±0.05) are evaluated as viewed horizontally, it is determined in a horizontal state even if it is not mathematically (0, 0, 0).

Compared with the table, it is shown in Table 9 below.

TABLE 9

The measured values in the state of FIG. 12A and FIG. 12B in the first temperature atmosphere.

| | Intrinsic Error in a Temperature Atmosphere of the First Temperature | Measured Value V1 at the First Angle | Measured Value V2 at the Second Angle | V1 − V2 | Evaluation |
|---|---|---|---|---|---|
| First Sensor 621 | (1, 1, −1) | (1, 1, −10.8) | (1, 1, −10.8) | (0, 0, 0) | Horizontal |
| Second Sensor 622 | (0.8, 0.7, −1.1) | (0.8, 0.7, −10.9) | (0.8, 0.7, −10.9) | (0, 0, 0) | Horizontal |
| Third Sensor 623 | (0.6, 0.7, −1) | (0.6, 0.7, −10.8) | (0.6, 0.7, −10.8) | (0, 0, 0) | Horizontal |
| Fourth Sensor 624 | (0.5, 0.8, −1.2) | (0.5, 0.8, −11) | (0.5, 0.8, −11) | (0, 0, 0) | Horizontal |

As shown in FIG. 13A and FIG. 13B, when the wafer is supported by the support member 540, a case where the wafer is inclined by θ will be described. It is assumed that the first sensor 621 has an intrinsic error of (1, 1, −1) in the vector coordinates of (X, Y, Z) in the first temperature atmosphere around 70° C. It is assumed that the second sensor 622 has an intrinsic error of (0.8, 0.7, −1.1) in the vector coordinates of (X, Y, Z) in a temperature atmosphere around 70° C. It is assumed that the third sensor 623 has an intrinsic error of (0.6, 0.7, −1) in the vector coordinates of (X, Y, Z) in a temperature atmosphere around 70° C. In addition, it is assumed that the fourth sensor 624 has an intrinsic error by (0.5, 0.8, −1.2) in a temperature atmosphere around 70° C. to vector coordinates (X, Y, Z). It is assumed that vector coordinates according to the inclination of the substrate type sensor unit 1600 by θ in a state provided at the first angle is (2, 0.5, and −9.3). The measured value V1 measured in a state in which the substrate type sensor unit 600 according to the first step is provided at the first angle, the first sensor 621 is (3, 1.5, −10.3), the second sensor 622 is (2.8, 1.2, −10.4), the third sensor 623 is (−2.6, 4, −10.3), and the fourth sensor 624 is (−2.7, 4.1, −10.5). In addition, the measured value V2 measured while the substrate type sensor unit 600 according to the second step is provided at a second angle such that the first sensor 621 is (−1, 0.5, −10.3), the second sensor 622 is (−1.2, 0.2, −10.4), the third sensor 623 is (3.8, −2.6, −10.3), and the fourth sensor 624 is (3.7, −2.5, −10.5). When provided in a state capable of horizontally supporting the wafer, there is a substantially measured value, and in addition, an intrinsic error between each sensor is added as a vector sum. Accordingly, in the case of the first sensor 621, V1−V2 is (2.8, 1.2, 0), in the case of the second sensor 622, V1−V2 is (2.8, 1, 0), and in the case of the third sensor 623, V1−V2 is (−6.4, −6.6, 0), and in the case of the fourth sensor 624, V1−V2 is derived as a result of (−6.4, −6.6, 0).

Compared with the table, it is shown in Table 10 below.

Through (V1−V2)/2, the X value and Y value of the vector coordinates according to the inclination by θ in the state provided at the first angle may be known. (V1−V2)/2=(x, y, 0). As a result, when it is determined that the support member is not in a horizontal state, the inclined direction may be determined through an equation. In the embodiment, (V1−V2)/2=(x, y, 0)=(2, 0.5, 0) is derived through the first sensor 621 and the second sensor 622. In addition, (V1−V2)/2=(x, y, 0)=(−3.2, 3.3, 0) is derived by the third sensor 623 and the fourth sensor 624. Even if the numbers are different, this is the difference according to the rotation of the coordinate system. Considering that the g value of the acceleration used by the acceleration sensor is the Earth's gravitational acceleration, if calculated using a polar coordinate system, the z value of the inclination θ with respect to the plane is known as the x value and y value as may be referred by FIG. 15, and thus can be obtained as a value of g*sin(a). Alternatively, Pythagorean's theorem can be used through $$|z| = \sqrt{g^2 - (\sqrt{x^2 + y^2})}.$$

Considering the direction of gravity, the value of z is calculated as −|z|. As a result, vector coordinates according to the inclination of the substrate type sensor unit 600 by θ in a state provided at the first angle may be obtained using an acceleration sensor by $$\left(\frac{V1(x) - V2(x)}{2}, \frac{V1(y) - V2(y)}{2}, -\sqrt{g^2 - (\sqrt{x^2 + y^2})}\right).$$

In addition, (V1+V2)/2 may derive (an intrinsic error of the X value, an intrinsic error of the Y value, and a Z value of V1 (or V2). For example, in the embodiment, in the case of the first sensor 621, (V1+V2)/2=(1, 1, −10.3), and in the case of the second sensor 622, (V1+V2)/2=(0.8, 0.7, −10.4). In addition, in the case of the third sensor 623, (V1+V2)/2=(0.6, 0.7, −10.3), and in the case of the fourth sensor 624, (V1−V2)/2=(x, y, 0)=(0.5, 0.8, −10.5). In addition, the intrinsic error of the Z value may be calculated through a difference between V1(Z) or V2(Z) and a z value of an inclined value, which is $$z = -\sqrt{g^2 - (\sqrt{x^2 + y^2})}.$$

The above-described embodiments and formulas correspond to an embodiment of the inventive concept. Those skilled in the art will be able to derive various formulas and embodiments not disclosed based on the spirit of the invention described herein.

Figure 16:
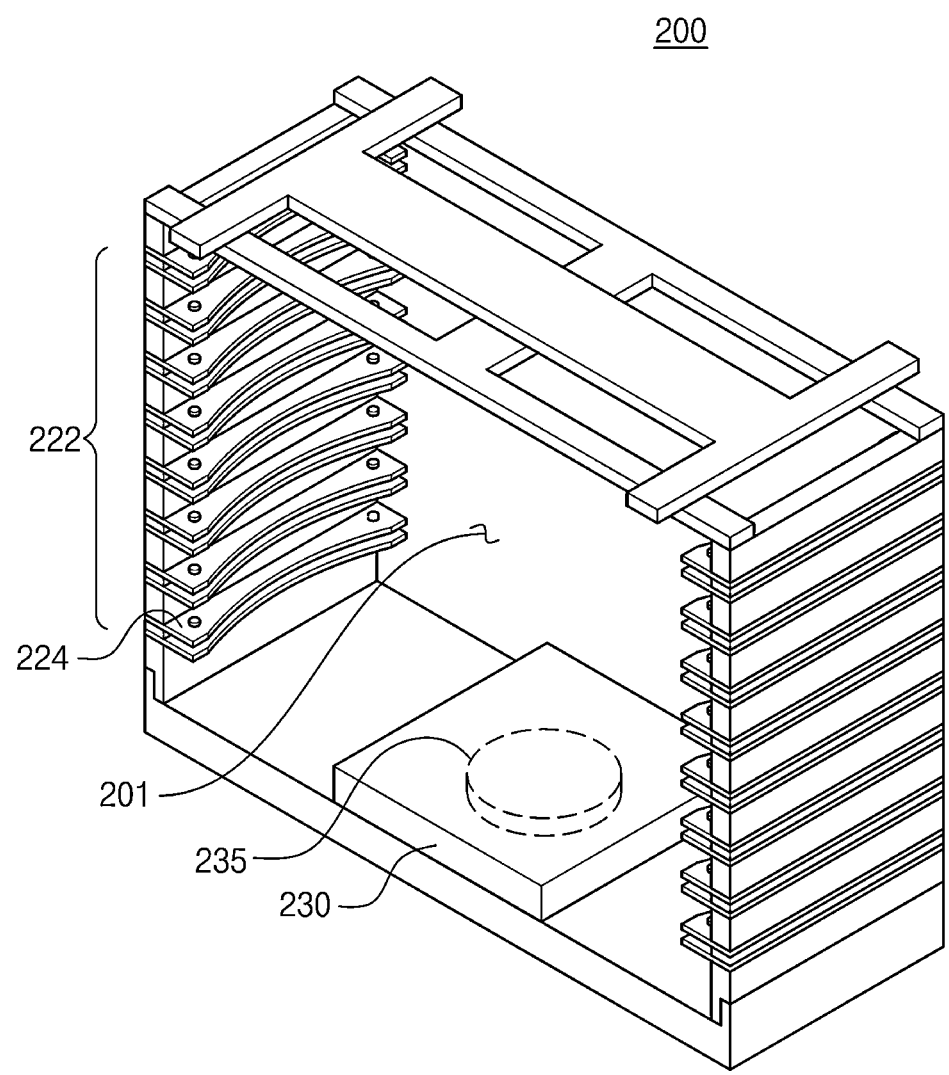
FIG. 16 is a perspective view schematically illustrating an embodiment of a buffer unit of FIG. 1.

FIG. 16 is a perspective view schematically illustrating an embodiment of the buffer unit of FIG. 1. Referring to FIG. 16, a buffer unit 200 according to an embodiment of the inventive concept will be described.

The buffer unit 200 is configured to temporarily store the substrate. The buffer unit 200 includes a housing providing a space 201 in which the substrate W is stored therein, and a slot 224 disposed in the housing and in which the substrate

TABLE 10

The measured values in the state of FIG. 13A and FIG. 13B in the first temperature atmosphere.

| | Intrinsic Error in a Temperature Atmosphere of the First Temperature | Measured Value V1 at the First Angle | Measured Value V2 at the Second Angle | V1 − V2 | Evaluation |
|---|---|---|---|---|---|
| First Sensor 621 | (1, 1, −1) | (3, 1.5, −10.3) | (−1, 0.5, −10.3) | (4, 1, 0) | Inclined |
| Second Sensor 622 | (0.8, 0.7, −1.1) | (2.8, 1.2, −10.4) | (−1.2, 0.2, −10.4) | (4, 1, 0) | Inclined |
| Third Sensor 623 | (0.6, 0.7, −1) | (−2.6, 4, −10.3) | (3.8, −2.6, −10.3) | (−6.4, −6.6, 0) | Inclined |
| Fourth sensor 624 | (0.5, 0.8, −1.2) | (−2.7, 4.1, −10.5) | (3.7, −2.5, −10.5) | (−6.4, −6.6, 0) | Inclined |

W is placed. A plurality of slots 224 are provided to be spaced apart from each other in the third direction 96. A plurality of slots 224 constitute a substrate storage unit 222. The slots 224 stack a plurality of wafers W in multiple stages.

A holding unit 230 for holding the substrate type sensor units 600 and 1600 is provided below the space 201 of the buffer unit 200. A top surface of the holding unit 230 is provided in a flat plane without inclination. The substrate type sensor units 600 and 1600 may be held by the holding unit 230 to zero adjust the sensor. A level sensor may also be provided to the holding unit 230 to periodically monitor and calibrate the substrate type sensor units 600 and 1600.

A wireless charging module 235 may be built-in in the holding unit 230. By embedding the wireless charging module 235, the power supply unit may be charged while storing the substrate type sensor units 600 and 1600 in the buffer unit 200.

By providing the buffer unit 200 with the wireless charging module 235 and the holding unit 230 capable of zero adjustment, the substrate type sensor units 600 and 1600 may be used at any time in the facility without being taken out of the facility.

In an embodiment, the wireless charging module 235 may charge the substrate type sensor units 600 and 1600 if necessary, using a magnetic induction (less than 5 cm) or a magnetic resonance (within 1 m), and may observe or transmit the data measured by the substrate type sensor units 600 and 1600.

Figure 17:
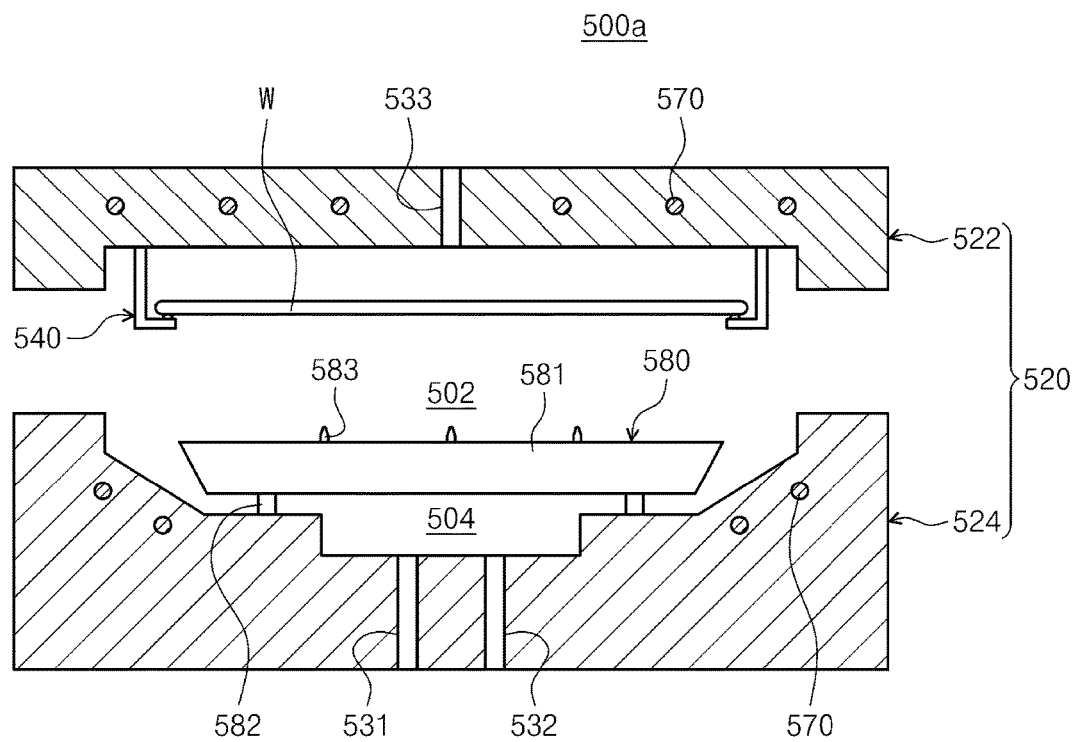
FIG. 17 is a view schematically illustrating another embodiment of the supercritical treating chamber of FIG. 1, and is a cross-sectional view illustrating a state in which a vessel is opened.
Figure 18:
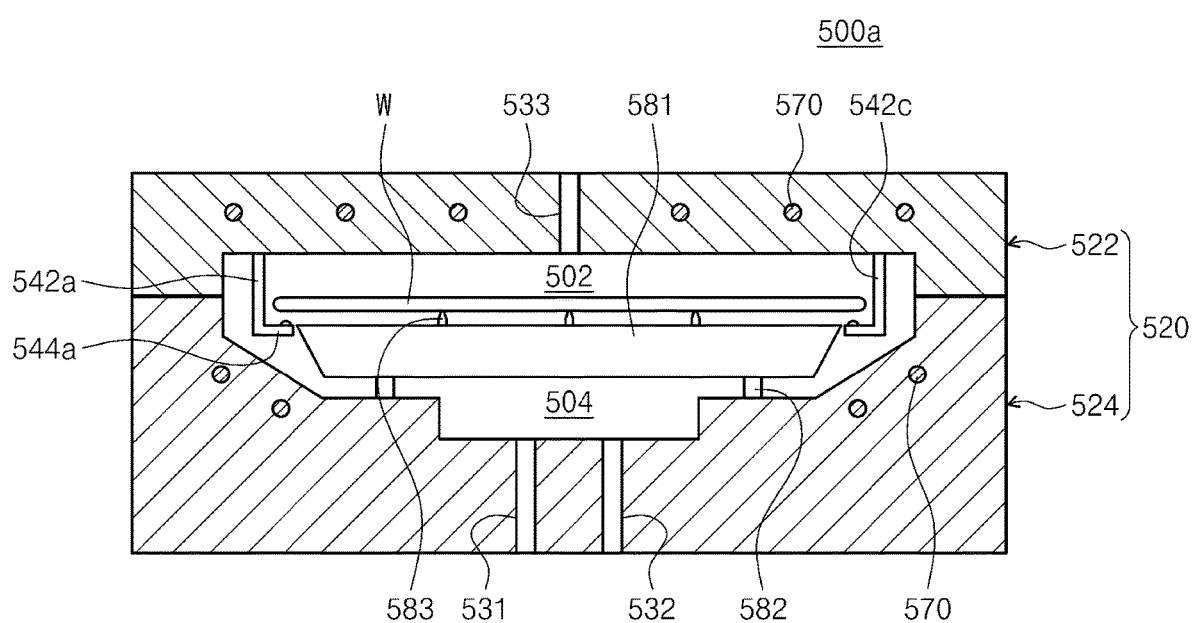
FIG. 18 is a cross-sectional view illustrating a state in which the vessel of the supercritical treating chamber according to an embodiment of FIG. 17 is closed.

FIG. 17 is a view schematically illustrating another embodiment of the supercritical treating chamber of FIG. 1, and is a cross-sectional view illustrating a state in which the vessel is opened. FIG. 18 is a cross-sectional view illustrating a state in which the vessel of the supercritical treating chamber according to an embodiment of FIG. 17 is closed. Another embodiment of the inventive concept will be described with reference to FIG. 17 and FIG. 18.

The substrate treating apparatus 500*a* may include a vessel 520, a first substrate support 540, a second substrate support 583, a first supply port 531, a second supply port 533, and an exhaust port 532.

The vessel 520 may provide a space for drying the substrate. The space may include a process region 502 and a buffer region 504. The process region 502 may be a region corresponding to the top surface of the substrate W, and the buffer region 504 may be a region located below the substrate W. The vessel 520 may include an upper vessel 522 and a lower vessel 524. The upper vessel 522 may include a top wall and a first sidewall. The top wall of the upper vessel 522 may be provided as the top wall of the vessel 520. The first sidewall of the upper vessel 522 may be provided as a portion of the sidewall of the vessel 520. The lower vessel 524 may include a bottom wall and a second sidewall. The bottom wall of the lower vessel 524 may be provided as a bottom wall of the vessel 520. The second sidewall of the lower vessel 524 may be provided as a portion of the sidewall of the chamber.

The upper vessel 522 and the lower vessel 524 may be relatively moved by a driving mechanism (not illustrated) to be engaged with each other to switch between a closed position (illustrated in FIG. 15) sealing the vessel 520 and an open position (illustrated in FIG. 14) opening the chamber. For example, at least one of the upper vessel 522 and the lower vessel 524 may move up and down along a lifting/lowering rod (not illustrated) to be coupled or separated from each other. In the open position of the vessel 520, the substrate W may be loaded/unloaded from/to the inside of the vessel 520. At the closed position of the vessel 520, the supercritical drying process of the substrate W may be performed.

Figure 14:
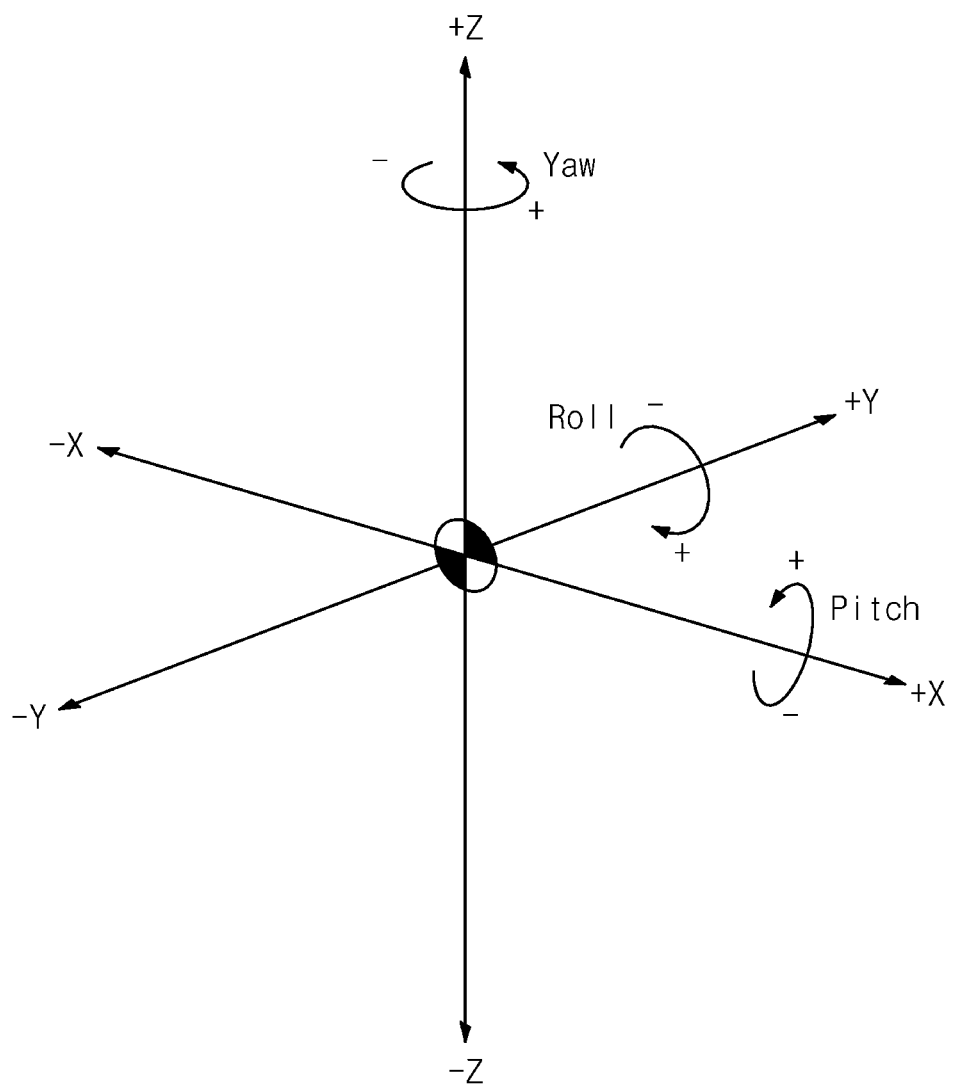
FIG. 14 is a coordinate axis for explaining a concept according to an embodiment of the inventive concept.
Figure 15:
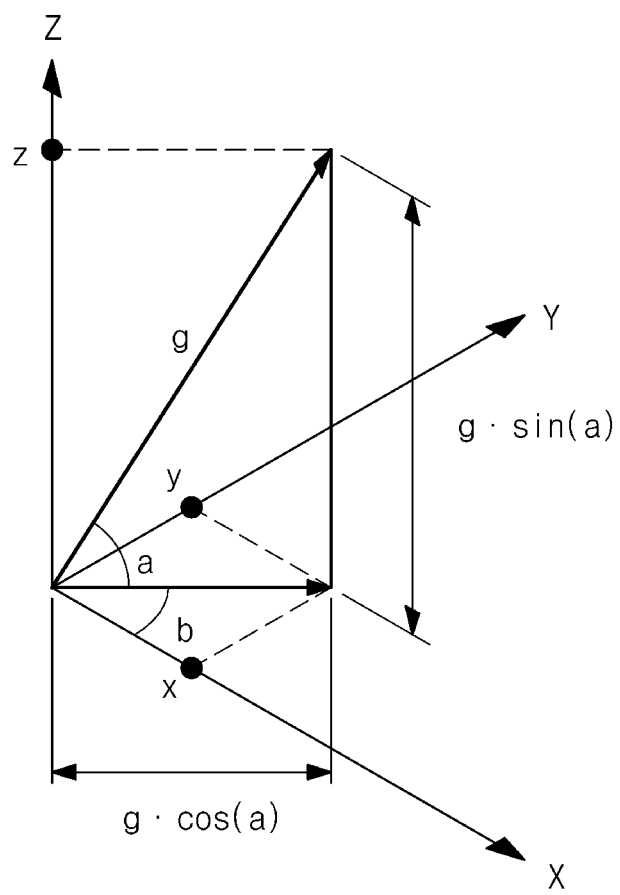
FIG. 15 is a coordinate axis for explaining a concept according to another embodiment of the inventive concept.

The first substrate support 540 may be disposed in the vessel 520 and may support the substrate W when the substrate W is loaded into the chamber. As illustrated in FIG. 14, the first substrate support 540 may support the substrate W when the substrate W is loaded/unloaded into the chamber at the open position of the vessel 520. The second substrate support 583 may be disposed in the vessel 520 and may support the substrate W when the substrate W is treated in the vessel 520. As shown in FIG. 15, the second substrate support 583 may support the substrate W when a supercritical fluid process is performed on the substrate W at the closed position of the vessel 520.

The first substrate support 540 may include a first support member extending from the top wall of the upper vessel 522 to support the substrate W at a position spaced apart from the top wall by a first distance. The first substrate support 540 may support the substrate W at a first height from the lower wall of the lower vessel 524 at a closed position of the vessel 520.

The substrate W loaded/unloaded to/from the chamber at the open position of the vessel 520 may be temporarily supported by the first substrate support 540. The substrate W supported by the first substrate support part 540 may be supported such that the top surface of the substrate W faces the top wall of the upper vessel 522, and the bottom surface of the substrate W faces the bottom surface of the lower vessel 524.

The substrate treating chamber 500*a* may include a blocking plate 580 disposed between the lower wall of the lower vessel 524 and the first substrate support 540. The blocking plate 580 may be installed to be spaced apart from the lower wall of the lower vessel 524 by a predetermined distance. The blocking plate 580 may be fixed on the lower wall of the lower vessel 524 by a support rod 582. The blocking plate 580 may include a plate having a predetermined thickness occupying a predetermined space in the buffer region 504. The blocking plate 580 may block the supercritical fluid from the first supply port 531 from being directly sprayed onto the bottom surface of the substrate W. A volume of the buffer region 504 may be reduced by the blocking plate 580. The volume of the buffer region 504 may be smaller than a volume of the process region 502. Accordingly, the amount of the supercritical fluid present in the buffer region 504 below the substrate W may be relatively less than the amount of the supercritical fluid present in the process region 502 above the substrate W. The blocking plate 580 may reduce the process time by reducing the buffer space by placing a structure in the buffer space at the lower part of the substrate W in order to reduce the amount of supercritical fluid used in the drying process and to maintain a process performance.

The second substrate support 583 supports the substrate W at a position spaced apart from the top wall of the upper vessel 522 by a second distance. The second support member may support the substrate W at a second height greater than the first height from the lower wall of the lower vessel 524 at a closed position of the chamber.

The second substrate support 583 may be disposed on the blocking plate 580 and support the substrate W. The second substrate support 583 may include a plurality of second support protrusions 152 extending upward from the top surface of the blocking plate 580. The second support protrusions may extend upward on the blocking plate 580 and contact and support the central region of the substrate W.

The second substrate support 583 is disposed on the blocking plate 580, but is not limited thereto, and the second substrate support 583 may be installed to have a predetermined height from the lower wall of the lower vessel 524.

When the vessel 520 is opened, the second support protrusions forming the second substrate support 583 may move together with the lower vessel 524. Subsequently, the substrate W may be loaded into the vessel 520 and seated on the first support protrusions of the first substrate support 540. When the vessel 520 is closed, the second support protrusions forming the second substrate support 583 may rise together with the lower vessel 524. Since the second support protrusions forming the second substrate support 583 at the closed position of the vessel 520 have a larger height than the first support protrusions of the first substrate support 540, the substrate W may be seated on the second support protrusions forming the second substrate support 583. Subsequently, the supercritical drying process may be performed on the substrate W supported by the second substrate support part 583.

Substrate type sensor units 600 and 1600 according to an embodiment of the inventive concept may be provided in the supercritical treating chamber according to other embodiments referred to in FIG. 17 and FIG. 18 to measure an inclination of the second substrate support 583.

In addition, although an embodiment of the inventive concept has been provided in the supercritical treating chamber to measure the horizontal level of the support member, the present specification may be applied to horizontal measurements requiring a high density in a high temperature environment.

In addition, since this invention performs measurement under specific environmental conditions, measurement accuracy is higher in specific situations compared to a method in which the acceleration sensor uses a correction coefficient to correct temperature-sensitive matters.

Although the case where the intrinsic error is large in the high-temperature environment has been described above, horizontal measurement is possible even at a room temperature.

The inclination of the support member 540 measured by the substrate type sensor units 600 and 1600 described above may be calculated by a non-transitory computer-readable medium storing a program code executable by a processor.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A buffer unit for temporarily storing a substrate, the buffer unit comprising:
a housing having a space for storing a substrate therein;
one or more slots disposed within the housing for placing the substrate thereon; and
a holding unit disposed at a bottom portion of the housing, having a flat and non-inclined top surface, and comprising a built-in wireless charging module,
wherein a substrate type sensor is supported by the flat and non-inclined top surface of the holding unit, and
wherein the holding unit further comprises a level sensor configured to measure a degree of inclination of the flat and non-inclined top surface of the holding unit.

2. A buffer unit for temporarily storing a substrate, the buffer unit comprising:
a housing having a space for storing a substrate therein;
one or more slots disposed within the housing for placing the substrate thereon; and
a holding unit disposed at a bottom portion of the housing, having a flat and non-inclined top surface, and comprising a built-in wireless charging module,
wherein a substrate type sensor is supported by the flat and non-inclined top surface of the holding unit,
wherein the buffer unit is disposed between an index module and a transfer apparatus of a treating module, and
wherein the treating module includes an apparatus for treating the substrate at a temperature higher than a room temperature.

3. A buffer unit for temporarily storing a substrate, the buffer unit comprising:
a housing having a space for s a substrate therein;
one or more slots disposed within the housing for placing the substrate thereon; and
a holding unit disposed at a bottom portion of the housing, having a flat and non-inclined top surface, and comprising a built-in wireless charging module,
wherein a substrate type sensor is supported by the flat and non-inclined top surface of the holding unit,
wherein the substrate type sensor comprises:
a substrate shaped-member;
a level measuring member provided at the substrate shaped-member;
a communication unit configured to receive a data from the level measuring member; and
a power unit configured to provide a power to the level measuring member and the communication unit, and
wherein the power unit is charged by the built-in wireless charging module.

4. The buffer unit of claim 3,
wherein the substrate type sensor is a sensor configured to measure a degree of a horizontality of a support member supporting the substrate under a temperature varying atmosphere, and
wherein the level measuring member is provided at the substrate shaped-member and comprises at least one sensor which is a 3-axis or more acceleration sensor or a 6-axis or more inertia measurement unit (IMU).

5. The buffer unit of claim 4,
wherein the at least one sensor comprises a plurality of sensors, and
wherein two opposite sensors of the plurality of sensors are arranged such that a center point of the substrate shaped-member is on a line defined by connecting the two opposite sensors.

6. The buffer unit of claim 4,
wherein the at least one sensor of the level measuring member generates an intrinsic error varying according to a temperature.

7. The buffer unit of claim 3,
wherein the substrate shaped-member has a substantially same physical size with a size of the substrate.

8. The buffer unit of claim 3, further comprising:
a transmission unit transmits the data received by the communication unit to the outside.

\* \* \* \* \*